US012796074B2

(12) United States Patent
Hsu et al.

(10) Patent No.: US 12,796,074 B2
(45) Date of Patent: Nov. 10, 2026

(54) METHOD OF FORMING A FORKSHEET GATE STACK STRUCTURE

(71) Applicant: TAIWAN SEMICONDUCTOR MANUFACTURING COMPANY, LTD., Hsinchu (TW)

(72) Inventors: Che-Chia Hsu, Taoyuan City (TW); Chih-Pin Tsao, Hsinchu County (TW); Chih-Hong Hwang, New Taipei City (TW); Shih-Hsun Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 758 days.

(21) Appl. No.: 18/092,677

(22) Filed: Jan. 3, 2023

(65) Prior Publication Data

US 2024/0222377 A1 Jul. 4, 2024

(51) Int. Cl.

| | |
|---|---|
| ***H10D 84/85*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |

(52) U.S. Cl.

CPC ....... *H10D 84/853* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/0193* (2025.01); *H10D 84/038* (2025.01)

(58) Field of Classification Search

CPC .......... H10D 30/6735; H10D 30/6757; H10D 62/121; H10D 64/017; H10D 84/853; H10D 84/0167; H10D 84/0193; H10D 84/038; H10D 84/0177; H10D 84/85

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — William B Partridge
*Assistant Examiner* — Chevy J Boegel
(74) *Attorney, Agent, or Firm* — Birch, Stewart, Kolasch & Birch, LLP

(57) ABSTRACT

A semiconductor device includes a plurality of nanostructures over a substrate arranged in a z-axis and a gate stack wrapping around the plurality of nanostructures. Thea gate stack comprises a gate dielectric layer and a p-type work function material on the gate dielectric layer. The gate dielectric layer wraps around the plurality of nanostructures. The p-type work function material has a first thickness along the z-axis above a topmost one of the plurality of nanostructures and a second thickness along the z-axis between neighboring two of the plurality of nanostructures, and the first thickness is less than the second thickness.

20 Claims, 28 Drawing Sheets

(56) References Cited

U.S. PATENT DOCUMENTS

| | | | | |
|---|---|---|---|---|
| 9,608,116 | B2 | 3/2017 | Ching et al. | |
| 2020/0135588 | A1* | 4/2020 | Wu | H10D 84/0177 |
| 2020/0328213 | A1* | 10/2020 | Cheng | H10D 30/6757 |
| 2021/0359096 | A1* | 11/2021 | Lee | H10D 64/685 |
| 2021/0407861 | A1* | 12/2021 | Savant | H10D 84/0188 |

* cited by examiner

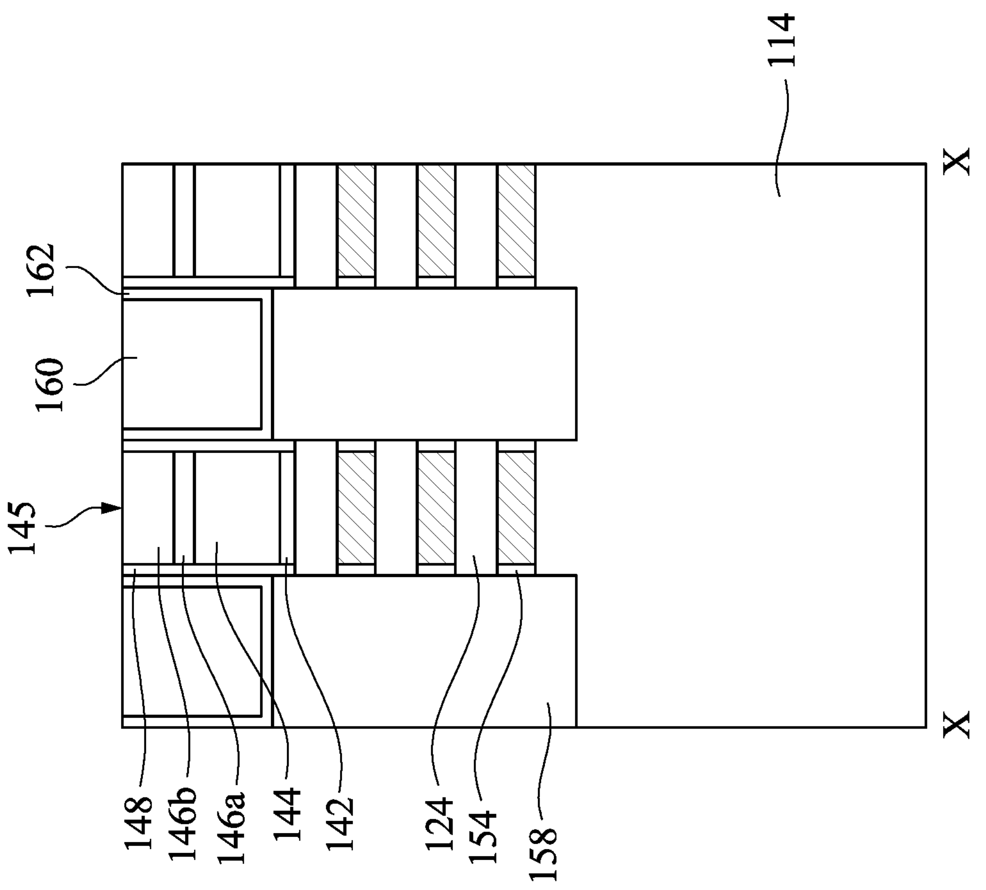
Fig. 11
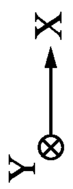

METHOD OF FORMING A FORKSHEET GATE STACK STRUCTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10B, 11 and 12 are cross-sectional views of a method of manufacturing a semiconductor device at various stages in accordance with some embodiments.

DETAILED DESCRIPTION

Figure 1:
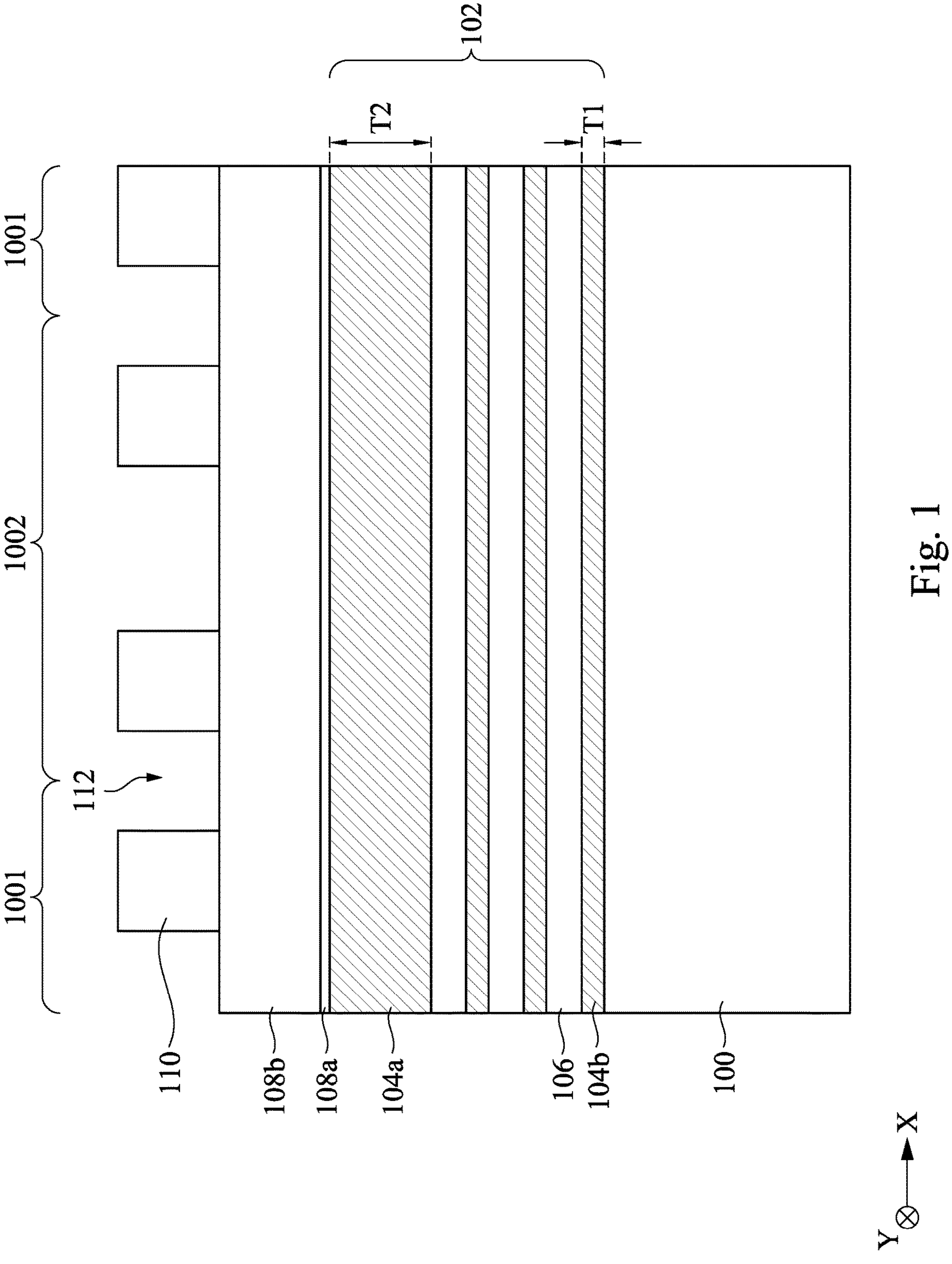
FIGS. 1-7 are cross-sectional views of a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors having fish-bone structures or fork-sheet structures. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as fin field effect transistors (FinFET), on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

The present disclosure provides a GAA transistor including a fork-sheet structure to allow n-type devices and p-type devices to be formed close to one another. One aspect of embodiments of the present disclosure provides an improved thickness design flexibility for the p-type work function metal. A threshold voltage shift or a localized threshold voltage mismatch issue caused by merging of the p-type work function metal along the x-axis can be prevented. An enlarged process window along the x-axis during formation of the n-type work function layer can thus be provided.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 1-7, 10B, 11 and 12 are cross-sectional views of a method of manufacturing a semiconductor device at various stages in accordance with some embodiments. FIGS. 8, 9, 10A, and 13A are perspective views of a method of manufacturing a semiconductor device at various stages in accordance with some embodiments. FIG. 13B is a perspective cross-sectional view showing a cross-sectional view cutting along line X1'-X1' of FIG. 13A. FIG. 13C is a cross-sectional view cutting along line Y1-Y1 of FIG. 13B. FIG. 13D is a cross-sectional view cutting along line X1-X1 of FIG. 13B. FIGS. 14A, 15A, 16A, 17A, 18A, 19A, 20A, 21A, 22A, 23A and 24A are cross-sectional views cutting along line Y1-Y1 of FIG. 13B at various stages in accordance with some embodiments. FIGS. 14B, 15B, 15C, 15D, 16B, 17B, 18B, 19B, 20B, 21B, 22B, 23B and 24B are cross-sectional views cutting along line X1-X1 of FIG. 13B at various stages in accordance with some embodiments. For the ease and accuracy of orientation referral, an x-y-z coordinate reference is provided, in which the x-axis is generally orientated along a substrate surface in a first direction, the y-axis is generally oriented along the substrate surface perpendicular to the x-axis, while the z-axis is oriented generally along the vertical direction with respect to the planar surface of a substrate (which, in most cases, defined by the x-y plane). The x-axis and the y-axis are perpendicular to the z-axis.

In FIG. 1, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has n-type regions 1001 and a p-type region 1002. The n-type regions 1001 are regions in which n-channel metal-oxide-semiconductor (NMOS) transistors, e.g., n-type GAA-FETs will reside, and the p-type region 1002 is a region in which p-type devices, such as p-channel metal-oxide-semiconductor (PMOS) transistors, e.g., p-type GAA-FETs will reside. In some embodiments, the first transistors are different from the second transistors at least in threshold voltage. For example, first transistors in the n-type regions 1001 may be High Voltage (HV) devices (e.g., I/O devices), and second transistors in the p-type region 1002 may be Low Voltage (LV) devices (e.g., logic devices).

The n-type regions 1001 may be separated from the p-type region 1002, and any number of device features (e.g., other active devices, doped regions, isolation structures, etc.) may be disposed between the n-type regions 1001 and the p-type region 1002. Although two n-type regions 1001 and one p-type region 1002 are illustrated, any number of the n-type regions 1001 and the p-type region 1002 may be provided.

Further in FIG. 1, a multi-layer stack 102 is formed over the substrate 100. The multi-layer stack 102 includes alternating layers of first semiconductor layers 104 and second semiconductor layers 106. For purposes of illustration and as discussed in greater detail below, the first semiconductor layers 104 will be removed and the second semiconductor layers 106 will be patterned to form channel regions of GAA-FETs.

The first semiconductor layers 104 and the second semiconductor layers 106 may include one or more layers of Si, Ge, SiGe, GaAs, InSb, GaP, GaSb, InAlAs, InGaAs, GaSbP, GaAsSb or InP. In some embodiments, the first semiconductor layers 104 and the second semiconductor layers 106 are made of Si, a Si compound, SiGe, Ge or a Ge compound. The first semiconductor layers 104 include a first composition and the second semiconductor layers 106 include a second composition different from the first composition. The first and second compositions have different oxidation rates and/or etch selectivity. For example, the first semiconductor layers 104 may include SiGe and the second semiconductor layers 106 may include Si.

The multi-layer stack 102 is illustrated as including four layers of the first semiconductor layers 104 and three layers of the second semiconductor layers 106 for illustrative purposes. In some embodiments, the multi-layer stack 102 may include any number of the first semiconductor layers 104 and the second semiconductor layers 106. Each of the layers of the multi-layer stack 102 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 106 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 104 of the first semiconductor material may be removed without significantly removing the second semiconductor layers 106 of the second semiconductor material, thereby allowing the second semiconductor layers 106 to serve as channel regions of GAA-FETs. The topmost first semiconductor layer 104*a* is thicker than other first semiconductor layers 104. For example, the topmost first semiconductor layer 104*a* has a thickness T2 greater than a thickness T1 of a bottommost first semiconductor layers 104*b*. By the topmost first semiconductor layer 104*a* being thicker than other first semiconductor layers 104, a subsequent dielectric fin can have an increased thickness.

A Pad layer 108*a* and a mask layer 108*b* may be formed on the multi-layer stack 102. The pad layer 108*a* may be a thin film comprising silicon oxide formed, for example, using a thermal oxidation process. The pad layer 108*a* may act as an adhesion layer between multi-layer stack 102 and the mask layer 108*b*. The pad layer 108*a* may also act as an etch stop layer for etching the mask layer 108*b*. In an embodiment, the mask layer 108*b* is formed of silicon nitride, for example, using low-pressure chemical vapor deposition (LPCVD). In other embodiments, the mask layer 108*b* is formed by thermal nitridation of silicon, plasma enhanced chemical vapor deposition (PECVD), or plasma anodic nitridation. The mask layer 108*b* is used as a hard mask during subsequent photolithography processes. A photo resist 110 is formed on the mask layer 108*b* and is then patterned, forming openings 112 in the photo resist 110.

Figure 2:
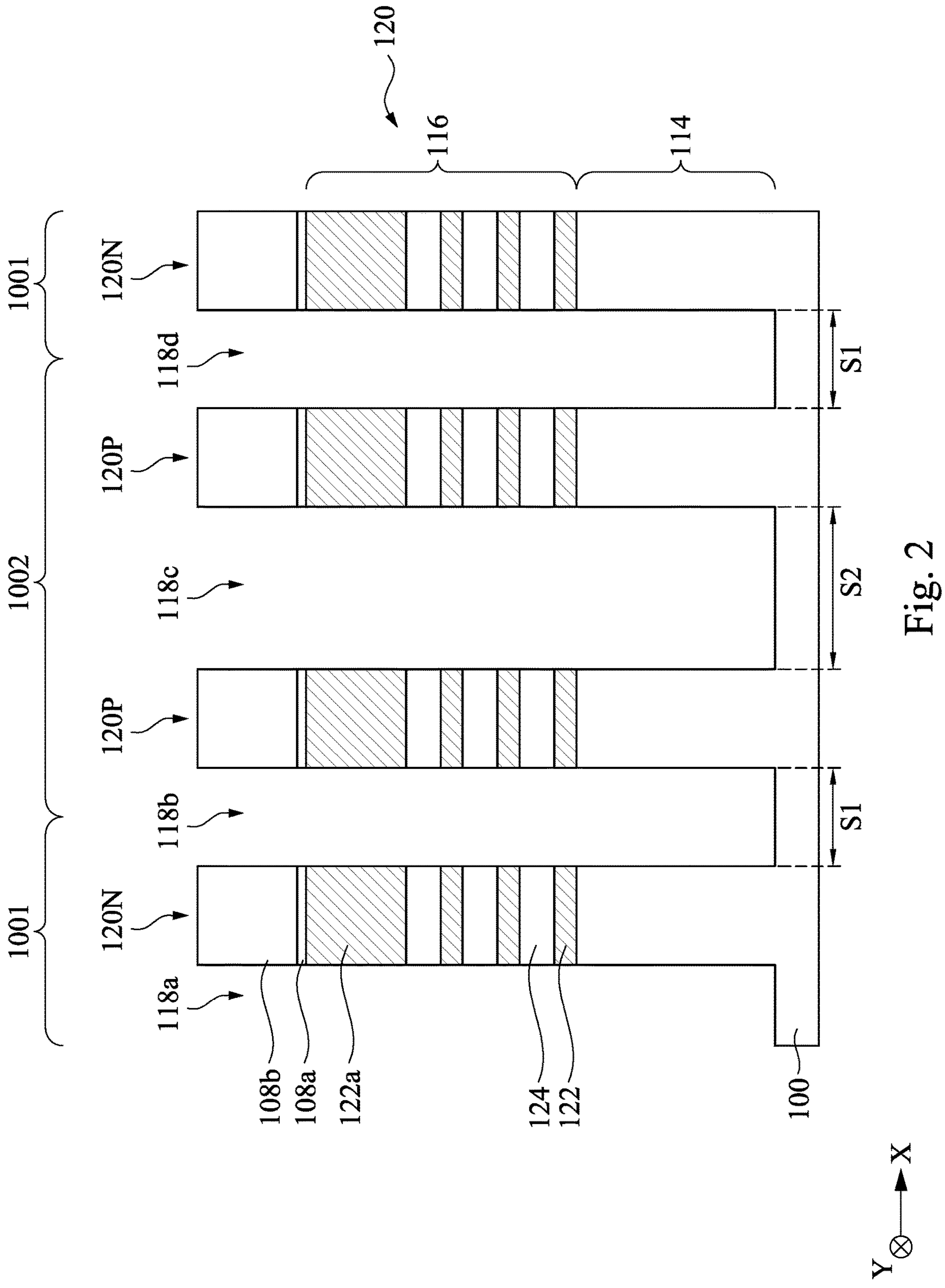

The mask layer 108*b* and the pad layer 108*a* are etched through the openings 112 to expose the underlying multi-layer stack 102. The photo resist 110 is removed. The exposed multi-layer stack 102 and the underlying substrate 100 are then etched to form trenches 118*a*, 118*b*, 118*c*, 118*d* in the multi-layer stack 102 and the substrate 100 using the mask layer 108*b* and the pad layer 108*a* as an etch mask. Fin structures 114 are formed in the substrate 100 and nanostructures 116 are formed in the multi-layer stack 102, in accordance with some embodiments, as shown in FIG. 2. Each fin structure 114 and overlying nanostructures 116 can be collectively referred to as a fin 120 extending from the substrate 100. The trenches 118*a*-118*d* separate neighboring nanostructures 116 and neighboring fin structures 114. The fin 120 includes fins 120N in the n-type regions 1001 and fins 120P in the p-type region 1002. The etching may be any acceptable etch process, such as a reactive ion etch (RIE), neutral beam etch (NBE), the like, or a combination thereof. The etching may be anisotropic. Forming the nanostructures 116 by etching the multi-layer stack 102 may further define first nanostructures 122 from the first semiconductor layers 104 and define second nanostructures 124 from the second semiconductor layers 106. The first nanostructures 122 and the second nanostructures 124 may further be collectively referred to as nanostructures 116.

The fin structures 114 and the nanostructures 116 may be patterned by any suitable method. For example, the fin structures 114 and the nanostructures 116 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 114 and the nanostructures 116.

FIG. 2 illustrates the fin structures 114 in the n-type region 1001 and the second device region 1002 as having substantially equal widths for illustrative purposes. In some embodiments, widths of the fin structures 114 in the n-type region 1001 may be greater or thinner than the fin structures 114 in the p-type region 1002. Further, while each of the fin structures 114 and the nanostructures 116 are illustrated as having a consistent width throughout, in other embodiments, the fin structures 114 and/or the nanostructures 116 may have tapered sidewalls such that a width of each of the fin structures 114 and/or the nanostructures 116 continuously increases in a direction towards the substrate 100. In such embodiments, each of the nanostructures 116 may have a different width and be trapezoidal in shape.

The process described above with respect to FIGS. 1 and 2 is just one example of how the fin structures 114 and the nanostructures 116 may be formed. In some embodiments, the fin structures 114 and/or the nanostructures 116 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 114 and/or the nanostructures 116. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nanostructures 122) and the second semiconductor layers (and resulting nanostructures 124) are illustrated and discussed herein as comprising the same materials in the p-type region 1002 and the n-type region 1001 for illustrative purposes only. As such, in some embodiments one or both of the first semiconductor layers and the second semiconductor layers may be different materials or formed in a different order in the n-type and p-type regions 1001 and 1002.

In some embodiments, the fin 120N in the n-type region 1001 and the fin 120P in the p-type region 1002 have a first spacing S1, and the two neighboring fins 120P in the p-type region 1002 have a second spacing S2. The second spacing S2 is greater than the first spacing S1. In other words, the trench 118*c* is wider than the trenches 118*b* and 118*d*.

Figure 3:
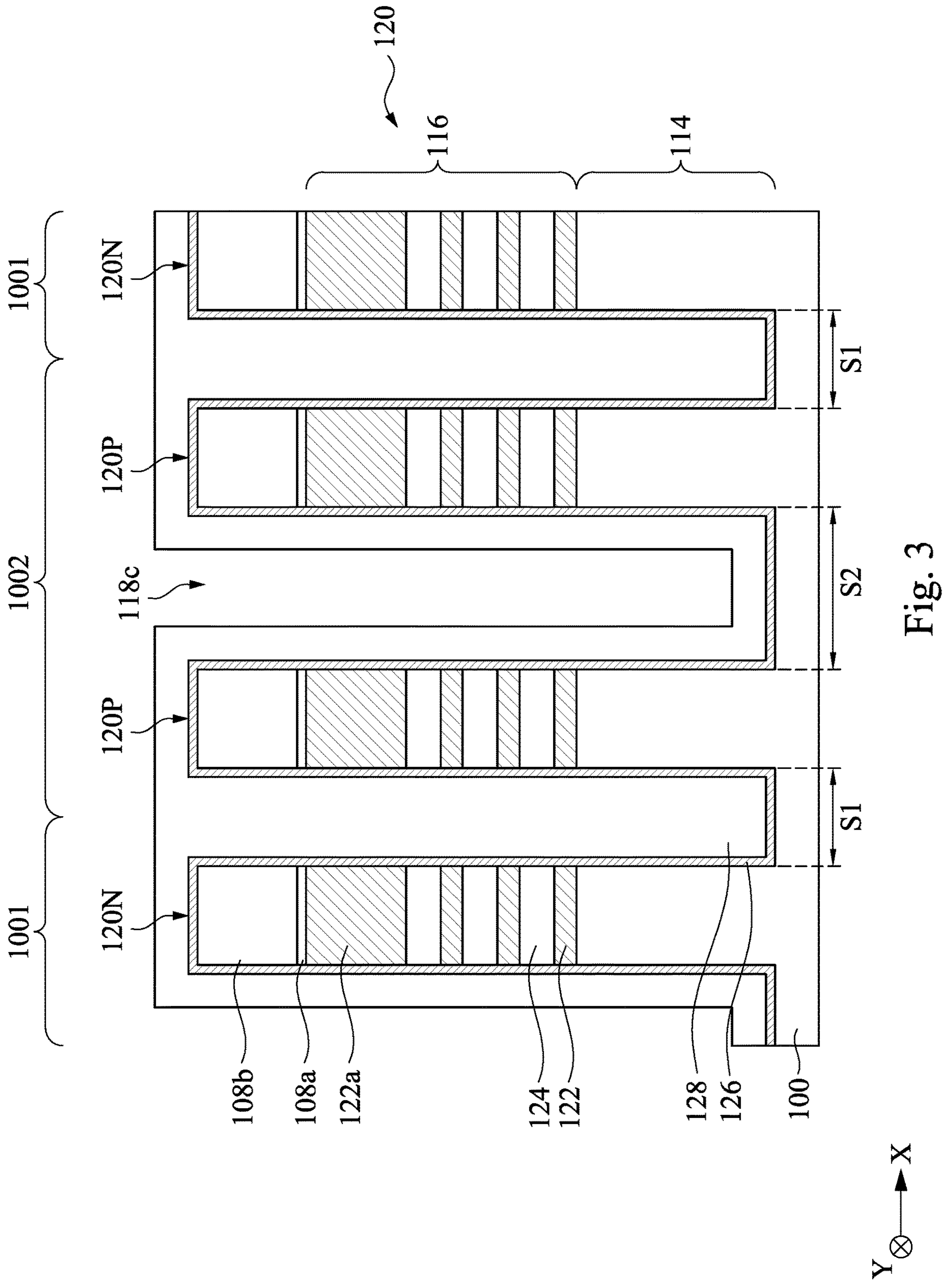

Referring to FIG. 3, a first dielectric film 126 and a second dielectric film 128 are formed in sequence on the fins 120, the pad layer 108*a* and the mask layer 108*b*. For example, the first dielectric film 126 is conformally deposited on the structure in FIG. 2 using CVD, ALD, or a suitable method. The first dielectric film 126 lines sidewalls and bottom surface of the trenches 118*a*-118*d*. The second dielectric film 128 is then conformally deposited on the first dielectric film 126 using CVD, ALD, or a suitable method. The first dielectric film 126 and the second dielectric film 128 include different low-k dielectric materials. For example, the first dielectric film 126 has different etch selectivity than the second dielectric film 128. In some embodiments, the first dielectric film 126 includes SiN, SiCN or the like, and the second dielectric film 128 includes SiOC, SiOCN or the like.

Due to width differences among the trenches 118$a$-118$d$, the second dielectric film 128 completely fills the trench 118$b$, which is narrower than the trench 118$c$, but does not completely fill the trench 118$c$.

Figure 4:
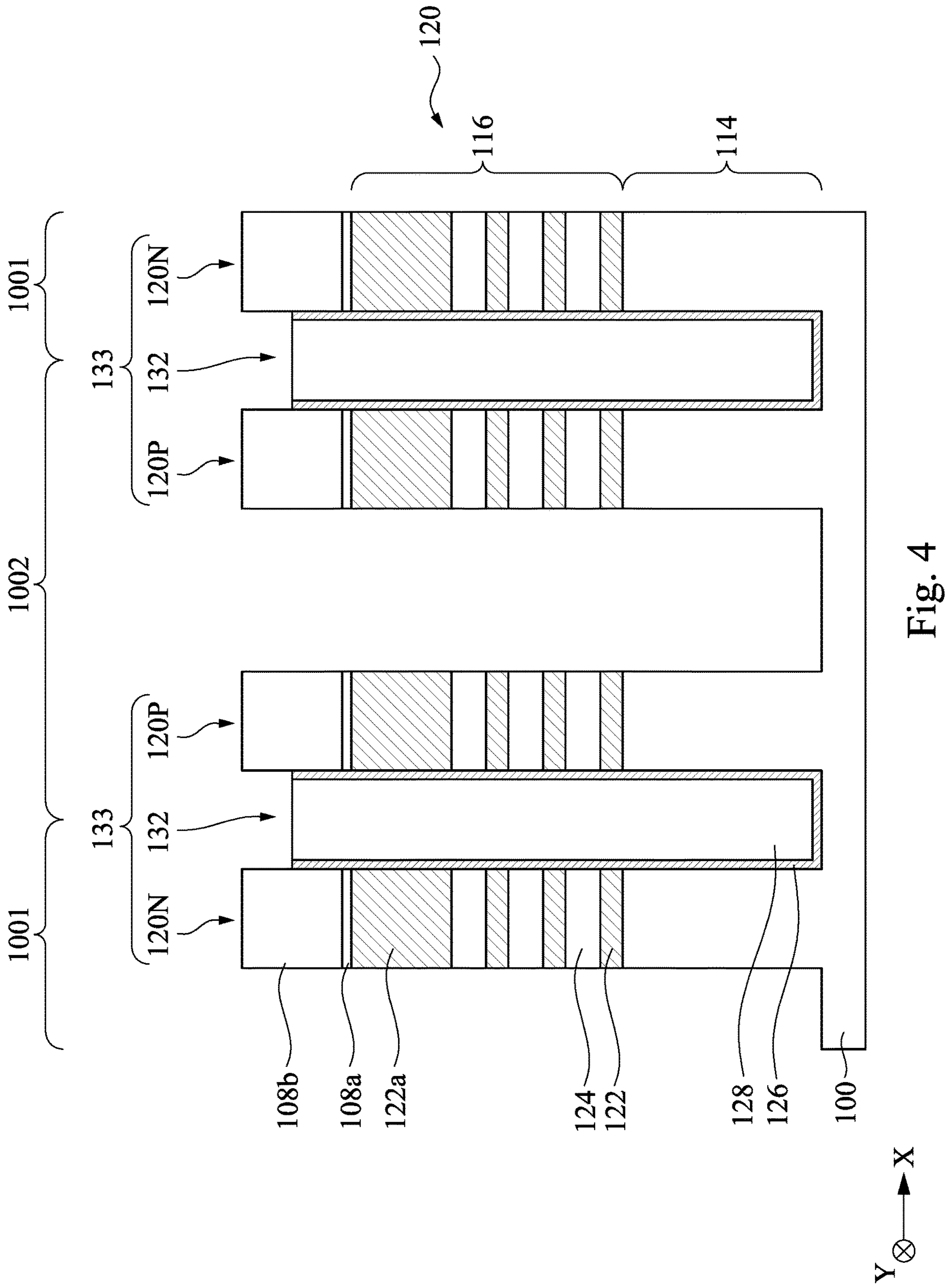

Reference is made to FIG. 4. Subsequently, the example process etches back the first dielectric film 126 and the second dielectric film 128 to remove a portion of the first dielectric film 126 and the second dielectric film 128 in the trenches 118$b$ and 118$d$ and completely remove first dielectric film 126 and the second dielectric film 128 from the trenches 118$a$ and 118$c$. In some embodiments, the first dielectric film 126 and the second dielectric film 128 may be etched back in a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second dielectric film 128 and a second stage that is directed toward the first dielectric film 126. Unlike the narrower trenches 118$b$ and 118$d$ which are entirely filled by the first dielectric film 126 and the second dielectric film 128, the wider trenches 118$a$ and 118$c$ allow etchant to etch sidewalls and bottom surface of the first dielectric film 126 and the second dielectric film 128 from inside the trenches 118$a$ and 118$c$, such that the first dielectric film 126 and the second dielectric film 128 are removed from the wider trenches 118$a$ and 118$c$ in a faster rate than from the narrower trenches 118$b$ and 118$d$.

As shown in FIG. 4, the first dielectric film 126 and the second dielectric film 128 are removed from the wider trenches 118$a$ and 118$b$, while the first dielectric film 126 and the second dielectric film 128 collectively define dielectric fins 132 in the narrower trenches 118$b$ and 118$d$, respectively. The dielectric fin 132 has a top at a height between a top of the mask layer 108$b$ and a top of the nanostructure 116. The dielectric fin 132 is between two neighboring fins 120. A pair of the fins 120 (i.e., the fin 120N and the fin 120P) with the dielectric fin 132 disposed between the pair of the fins 120 can be referred to as a fork-sheet structure 133. Although two n-type regions 1001 and one p-type region 1002 are illustrated, the substrate 100 can include any desired quantity of such regions. Each fork-sheet structure 133 is disposed at the boundaries of the n-type region 1001 and the p-type region 1002. Further, the fins 120N, 120P of each fork-sheet structure 133 alternate. In other words, each n-type region 1001 includes a first fin 120N from a first fork-sheet structure 133, and includes a second fin 120N from a second fork-sheet structure 133.

Figure 5:
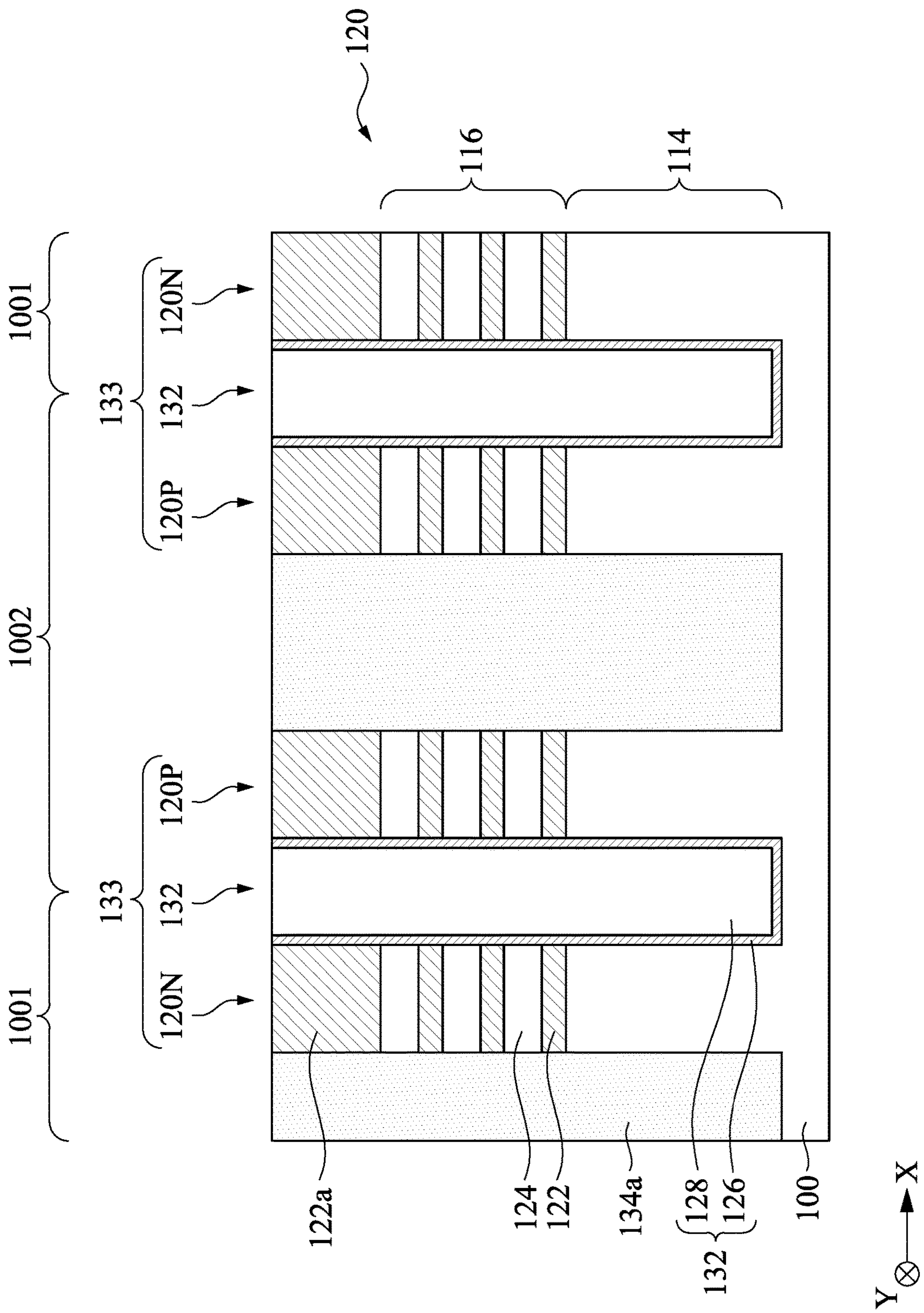

Next, in FIG. 5, an insulation material 134 is formed over the substrate 100 and on opposing sides of the fins 120. The insulation material 134 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 134 is silicon oxide formed by a FCVD process. An anneal process may be performed after the insulation material 134 is formed. The insulation material 134 may have materials different from the materials of the first dielectric film 126 and the second dielectric film 128 to achieve etching selectivity.

In an embodiment, the insulation material 134 is formed such that excess insulation material 134 covers the fins 120. In some embodiments, a liner (not shown) is first formed along surfaces of the substrate 100 and the fins 120, and a fill material, such as those discussed above is formed over the liner. In some embodiments, the liner is omitted. Next, a removal process is applied to the insulation material 134 to remove excess insulation material 134 over the fins 120. The mask layer 108$b$ and the pad layer 108$a$ are removed by the removal process. In some embodiments, a planarization process such as a chemical mechanical polish (CMP), an etch back process, combinations thereof, or the like may be utilized. The planarization process exposes the nanostructures 116 such that top surfaces of the nanostructures 116 and the insulation material 134 are level after the planarization process is complete.

Figure 6:
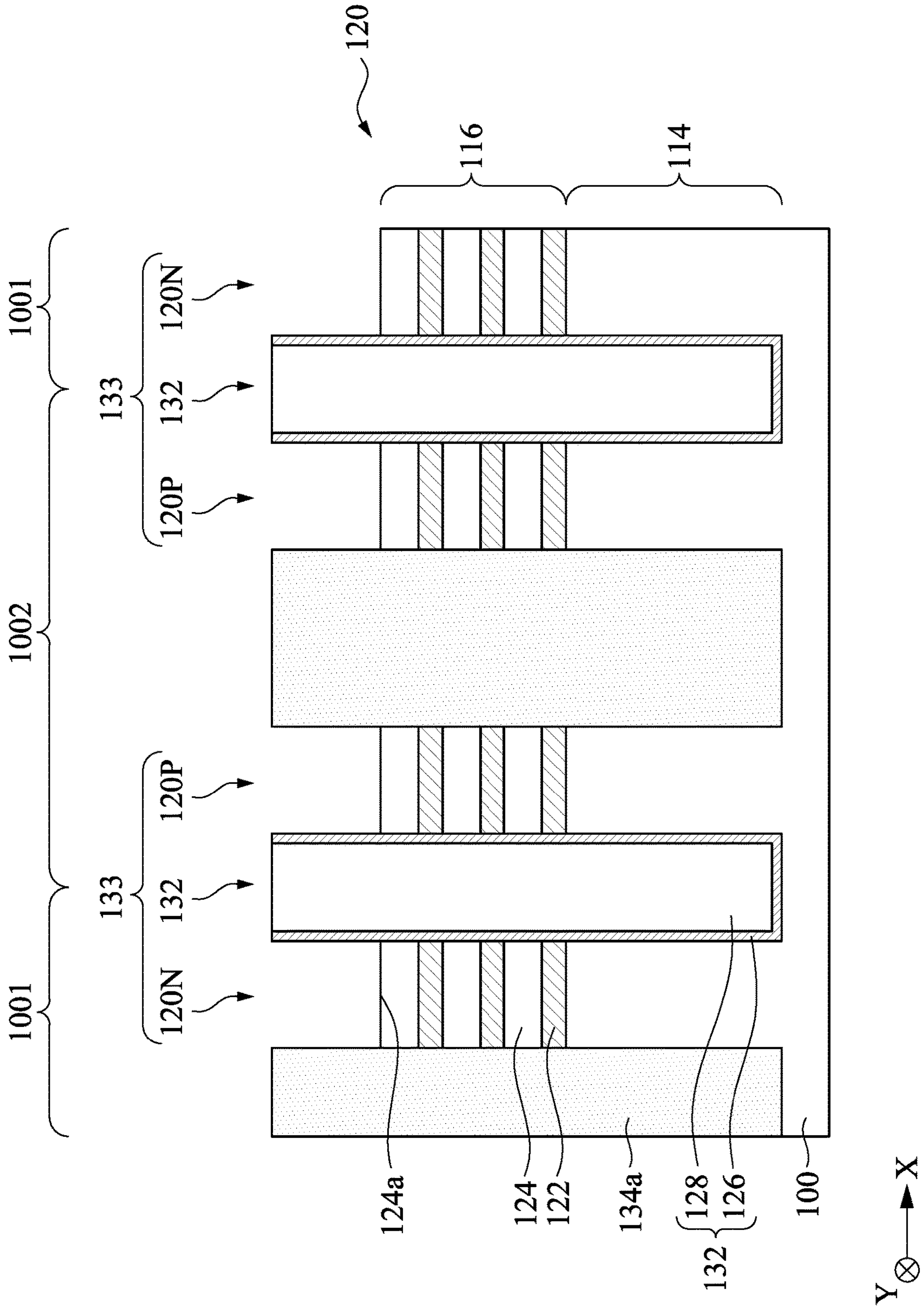

In FIG. 6, an etching process is performed to remove the topmost first nanostructure 122$a$, exposing a topmost second nanostructure 124$a$. In some embodiments in which the first nanostructures 122 include, e.g., SiGe, and the second nanostructures 124 include, e.g., Si or SiC, a dry etch process with tetramethylammonium hydroxide (TMAH), ammonium hydroxide ($NH_4OH$), or the like may be used to remove the topmost first nanostructure 122$a$. Due to the etch selectivity between the topmost first nanostructure 122$a$ and the topmost second nanostructure 124$a$, the etching process selectively removes the topmost first nanostructure 122$a$ without substantially damaging the topmost second nanostructure 124$a$.

Figure 7:
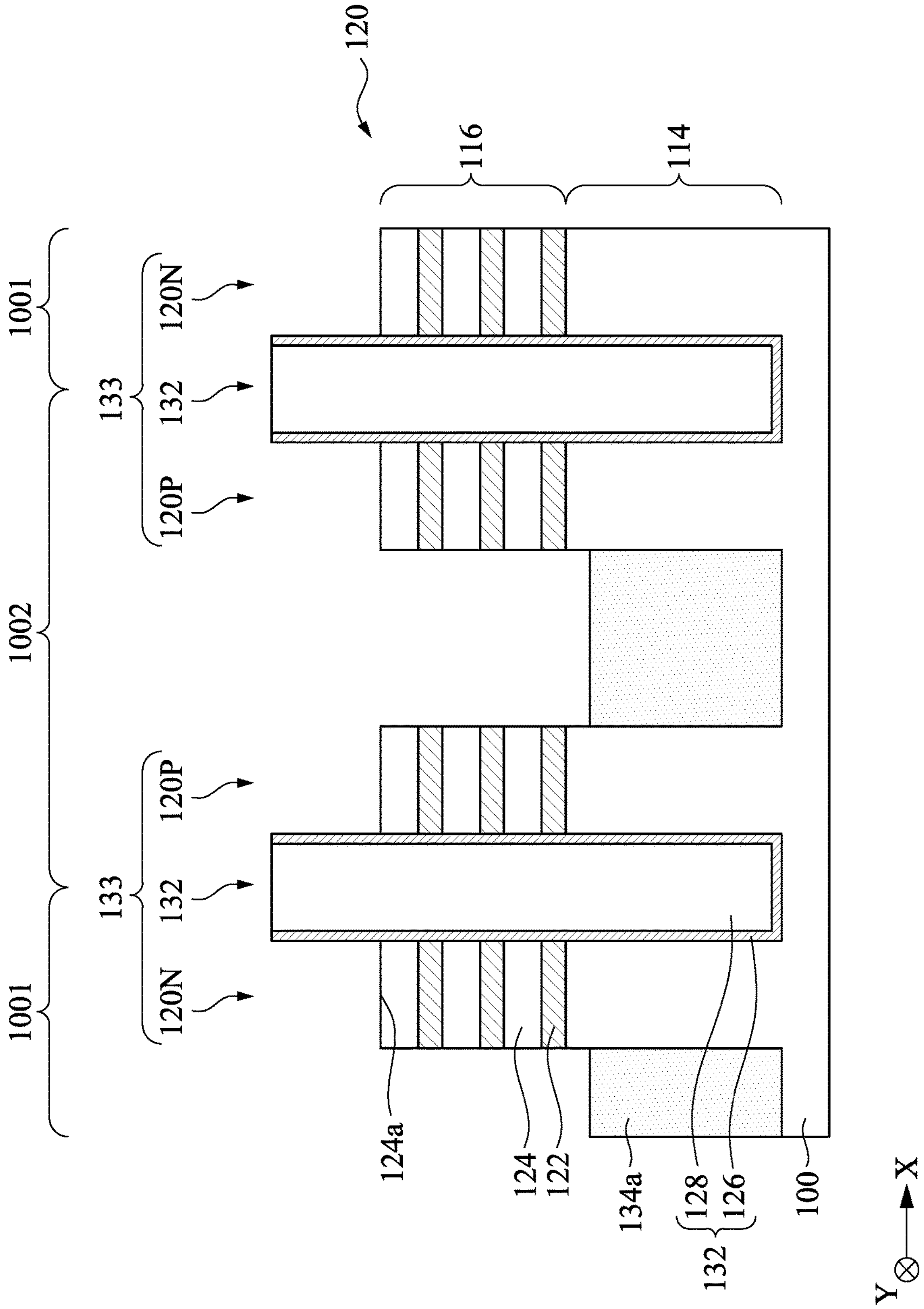

Referring to FIG. 7, a recessing process (e.g., etch back process) is performed to remove a portion of the insulation material 134, forming shallow trench isolation (STI) regions 134$a$. Due to the etch selectivity between the dielectric fin 132 and the insulation material 134, the recessing process selectively removes the insulation material 134 without substantially damaging the dielectric fin 132.

Figure 8:
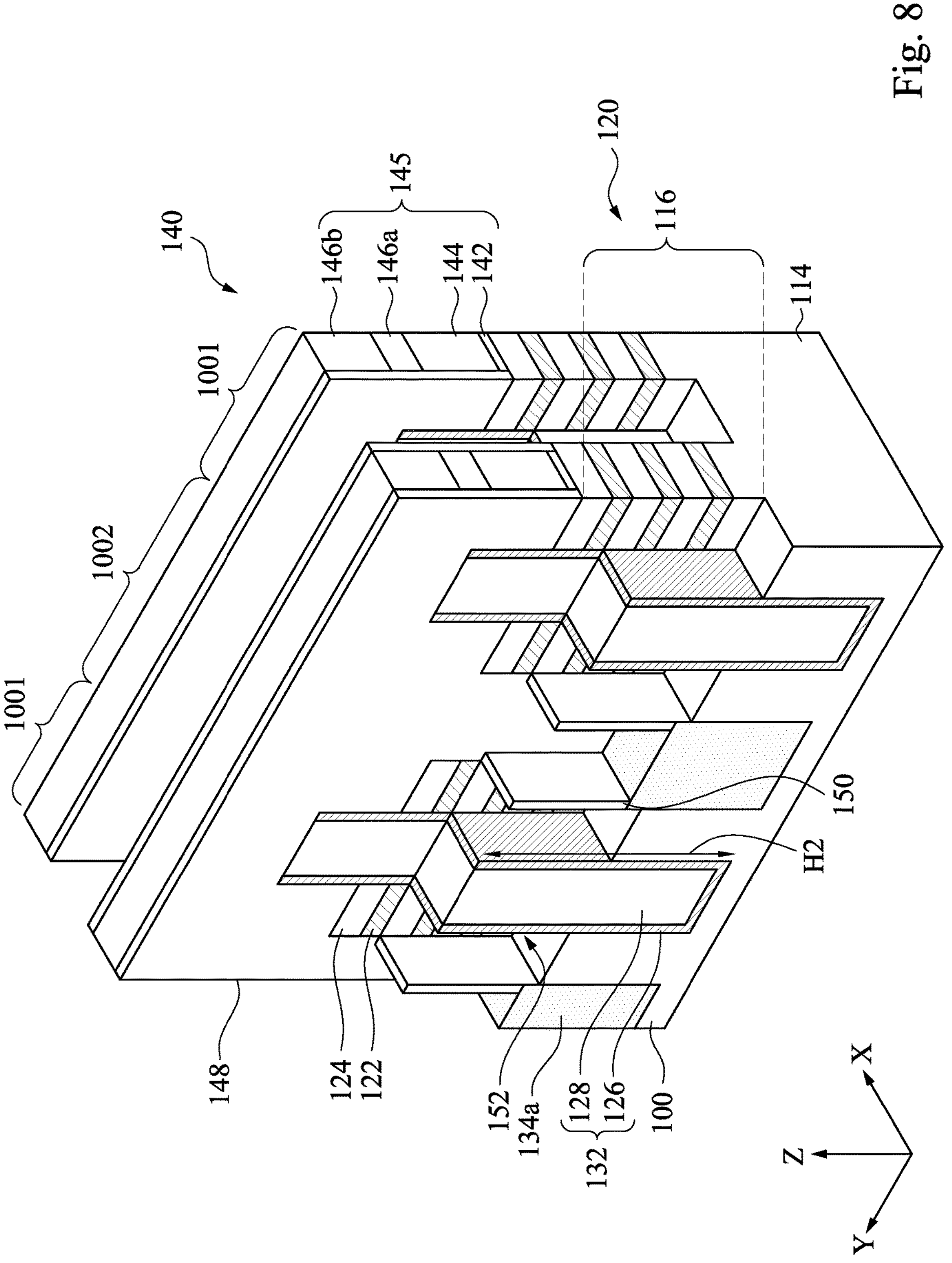
FIGS. 8, 9, and 10A are perspective views of a method of manufacturing a semiconductor device at various stages in accordance with some embodiments.

Referring to FIG. 8, a gate structure 140 is formed over the fins 120. The gate structure 140 includes a dummy gate stack 145 (represented by a dummy gate electrode 144 and in some implementations, a dummy gate dielectric 142), gate spacers 148, and a hard mask including multiple layers (e.g., a pad layer 146$a$ and a mask layer 146$b$). The gate structure 140 is disposed over channel region of the fins 120. The dummy gate electrode 144 includes a suitable dummy gate material, such as polysilicon. In implementations where the dummy gate stack 145 includes a dummy gate dielectric disposed between the dummy gate electrode 144 and the fins 120, the dummy gate dielectric 142 includes a dielectric material, such as silicon oxide, a high-k dielectric material, other suitable dielectric material, or combinations thereof. Examples of high-k dielectric material include $HfO_2$, HfSIO, HfSION, HfTaO, HfTIO, HfZrO, zirconium oxide, aluminum oxide, hafnium dioxide-alumina ($HfO_2$—$Al_2O_3$) alloy, other suitable high-k dielectric materials, or combinations thereof. The dummy gate stack 145 can include numerous other layers, for example, capping layers, interface layers, diffusion layers, barrier layers, hard mask layers, or combinations thereof. In some implementations, the dummy gate stack 145 further includes an interfacial layer (including, for example, silicon oxide) disposed between the dummy gate electrode 144 and the dummy gate dielectric 142. In some implementations, a capping layer (including, for example, titanium and nitrogen (such as a TiN capping layer)) can be disposed between the dummy gate electrode 144 and the fins 120.

The gate structure 140 is formed by deposition processes, lithography processes, etching processes, other suitable processes, or combinations thereof. For example, a deposition process is performed to form a dummy gate electrode layer over the substrate 100, particularly over the fins 120 and the STI regions 134*a*. In some implementations, a deposition process is performed to form a dummy gate dielectric layer over the fins 120 before forming the dummy gate electrode layer, where the dummy gate electrode layer is formed over the dummy gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some implementations, the dummy gate dielectric layer) to form the dummy gate stack 145, such that the dummy gate stack 145 (including the dummy gate electrode 144, the dummy gate dielectric 142, and/or other suitable layers) wraps a portion of channel region. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate spacers 148 are formed adjacent to the dummy gate stack 145 of the gate structure 140. Fin spacers 150 are formed on tops of the STI regions 134*a*. For example, the gate spacers 148 are disposed adjacent to (for example, along sidewalls of) the dummy gate electrode 144. The gate spacers 148 and the fin spacers 150 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over the fins 120 and the STI regions 134*a* and subsequently anisotropically etched to form the gate spacers 148 and the fin spacers 150. In some implementations, the fin spacers 150 and the gate spacers 148 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the dummy gate stack 145. In such implementations, the various sets of spacers can include materials having different etch rates. For example, a first dielectric layer including silicon and oxygen (for example, silicon oxide) can be deposited over the fins 120 and the STI regions 134*a* and subsequently anisotropically etched to form a first spacer set adjacent to the dummy gate stack 145 and on the STI regions 134*a*, and a second dielectric layer including silicon and nitrogen (for example, silicon nitride) can be deposited over the fins 120 and the STI regions 134*a* and subsequently anisotropically etched to form a second spacer set adjacent to the first spacer set.

Source/drain recesses 152 are formed in the nanostructures 116 and the substrate 100, in accordance with some embodiments. Epitaxial source/drain regions will be subsequently formed in the source/drain recesses 152. The source/drain recesses 152 may extend through the first nanostructures 122 and the second nanostructures 124, and into the substrate 100. Bottom surfaces of the source/drain recesses 152 are lower than top surfaces of the STI regions 134*a*, as an example. In some other embodiments, the fin structures 114 may be etched such that bottom surfaces of the source/drain recesses 152 are level with the top surfaces of the STI regions 134*a*. The source/drain recesses 152 may be formed by etching the nanostructures 116 and the substrate 100 using anisotropic etching processes, such as RIE, NBE, or the like. The gate spacers 148 and the mask layer 146*b* protect portions of the fin structures 114, the nanostructures 116, and the substrate 100 during the etching processes used to form the source/drain recesses 152. A single etch process or multiple etch processes may be used to etch each layer of the nanostructures 116 and/or the fin structures 114. Timed etch processes may be used to stop the etching of the source/drain recesses 152 after the source/drain recesses 152 reach a target depth.

A recessing process (e.g., etch back process) is performed to remove a portion of the dielectric fin 132 so that the dielectric fin 132 has a reduced height H1. A vertical distance between a top surface of the fin spacers 150 and a top surface of the recessed fin structure 114 is substantially the same as a distance between a top surface of the recessed dielectric fin 132 and the top surface of the recessed fin structure 114. In other words, the top surfaces of the dielectric fin 132 and the fin spacers 150 are at the same level heights.

Portions of sidewalls of the layers of the nanostructures 116 formed of the first semiconductor materials (e.g., the first nanostructures 122) exposed by the source/drain recesses 152 are etched to form sidewall recesses between corresponding second nanostructures 124. Although sidewalls of the first nanostructures 122 in recesses are illustrated as being straight in FIG. 9, the sidewalls may be concave or convex. The sidewalls may be etched using isotropic etching processes, such as wet etching or the like. In some embodiments in which the first nanostructures 122 include, e.g., SiGe, and the second nanostructures 124 include, e.g., Si or SiC, a dry etch process with tetramethylammonium hydroxide (TMAH), ammonium hydroxide ($NH_4OH$), or the like may be used to etch sidewalls of the first nanostructures 122.

Figure 9:
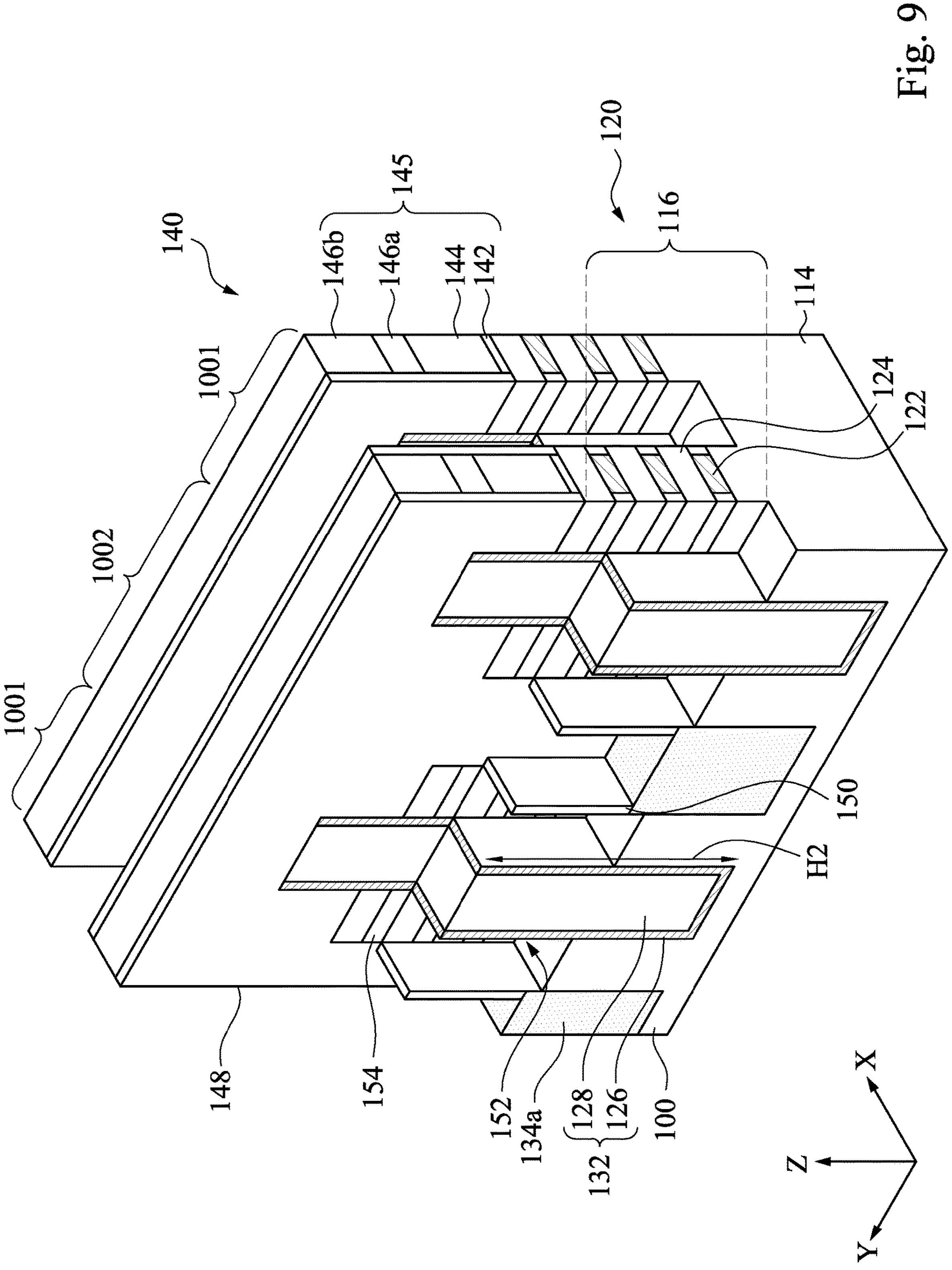

Inner spacers 154 are formed in the sidewall recess, as shown in FIG. 9. The inner spacers 154 act as isolation features between subsequently formed source/drain regions and gate structure. As will be discussed in greater detail below, source/drain regions will be formed in the source/drain recesses 152, and the first nanostructures 122 will be replaced with corresponding gate structures.

The inner spacers 154 may be formed by depositing an inner spacer layer using conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 154. Although outer sidewalls of the inner spacers 154 are illustrated as being flush with sidewalls of the second nanostructures 124, the outer sidewalls of the inner spacers 154 may extend beyond or be recessed from sidewalls of the second nanostructures 124.

Moreover, although the outer sidewalls of the inner spacers 154 are illustrated as being straight in FIG. 9, the outer sidewalls of the inner spacers 154 may be concave or convex. The inner spacer layer may be etched by an anisotropic etching process, such as RIE, NBE, or the like. The inner spacers 154 may be used to prevent damage to subsequently formed source/drain regions (such as the epitaxial source/drain regions 158, discussed below with respect to FIGS. 10A and 10B) by subsequent etching processes, such as etching processes used to form gate structures.

Figure 10A:
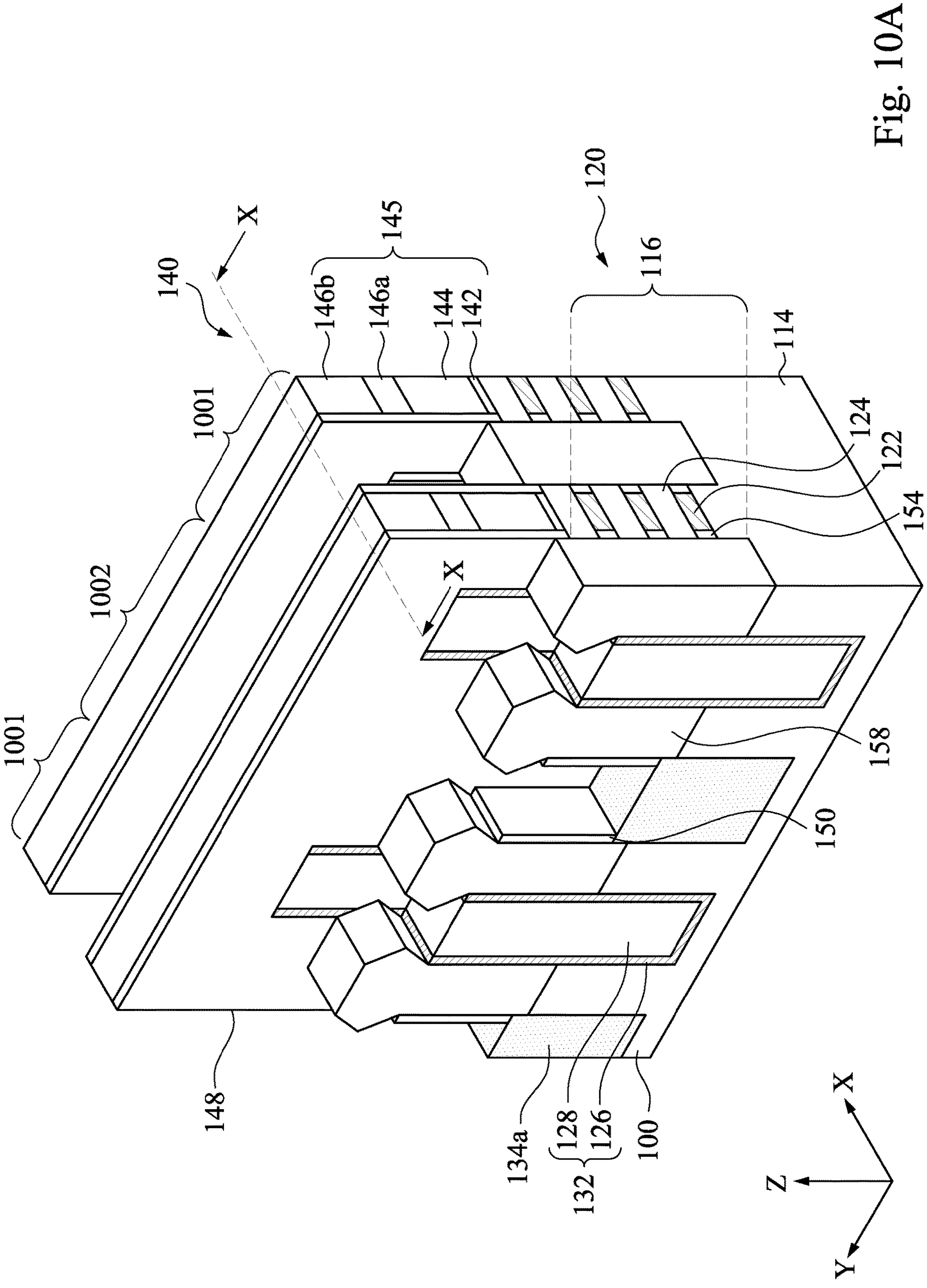
Figure 10B:
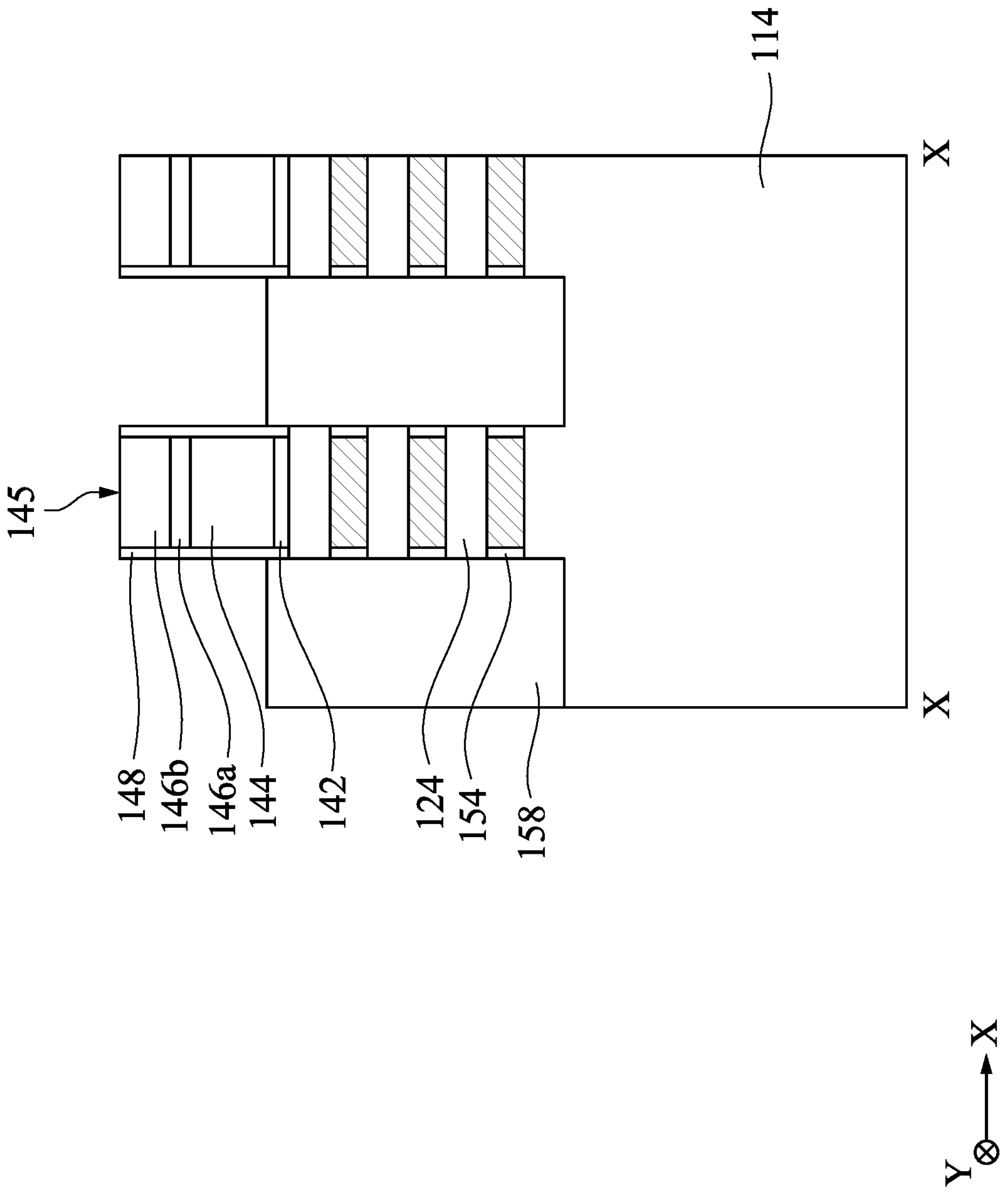

FIG. 10B is a cross-sectional view cutting along line X-X of FIG. 10A. In FIGS. 10A and 10B, epitaxial source/drain regions 158 are formed in the source/drain recesses 152. In some embodiments, the epitaxial source/drain regions 158 may exert stress on the second nanostructures 124, thereby improving device performance. The epitaxial source/drain regions 158 are formed in the source/drain recesses 152 such that each gate structure 140 is disposed between respective neighboring pairs of the epitaxial source/drain regions 158. In some embodiments, the gate spacers 148 are used to separate the epitaxial source/drain regions 158 from the dummy gate electrode 144 and the inner spacers 154 are used to separate the epitaxial source/drain regions 158 from the first nanostructures 122 by an appropriate lateral distance so that the epitaxial source/drain regions and 158 do not short out with subsequently formed gates of the resulting GAA-FETs.

In some embodiments, the epitaxial source/drain regions 158 may include any acceptable material appropriate for n-type GAA-FETs. For example, if the second nanostructures 124 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 158 may include any acceptable material appropriate for p-type GAA-FETs. For example, if the second nanostructures 124 are silicon, the epitaxial source/drain regions 158 may include materials exerting a compressive strain on the second nanostructures 124, such as silicon germanium, boron doped silicon germanium, germanium, germanium tin, or the like. The epitaxial source/drain regions 158 may have surfaces raised from respective upper surfaces of the nanostructures 116 and may have facets.

The epitaxial source/drain regions 158 may be implanted with dopants to form source/drain regions, followed by an anneal. The n-type and/or p-type impurities for source/drain regions 158 may be any of the impurities previously discussed. In some embodiments, the epitaxial source/drain regions 158 may be in situ doped during growth.

As a result of the epitaxy processes used to form the epitaxial source/drain regions 158, upper surfaces of the epitaxial source/drain regions 158 have facets which expand laterally outward beyond sidewalls of the nanostructures 116. In some other embodiments, adjacent epitaxial source/drain regions 158 remain separated after the epitaxy process is completed as illustrated by FIGS. 10A and 10B. The fin spacers 150 and the dielectric fin 132 block the lateral epitaxial growth of the epitaxial source/drain regions 158. Due to the tops of the fin spacers 150 and the dielectric fins 132 are at substantially the same level heights, the epitaxial source/drain regions 158 are each symmetric with respect to a z-axis perpendicular to the top surface of substrate 100.

In FIG. 11, an interlayer dielectric (ILD) layer 160 is deposited over the structure illustrated in FIG. 10B. The ILD layer 160 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 162 is disposed between the ILD layer 160 and the epitaxial source/drain regions 158, and the gate spacers 148. The CESL 162 may include a dielectric material, such as, silicon nitride, silicon oxide, silicon oxynitride, or the like, having a different etch rate than the material of the overlying ILD layer 160.

A planarization process, such as a CMP, may be performed to remove the hard mask including the pad layer 146*a* and the mask layer 146*b* on the dummy gate electrode 144. The planarization process levels the top surface of the ILD layer 160 with the top surfaces of dummy gate electrode 144 (see FIGS. 10A and 10B).

Figure 12:
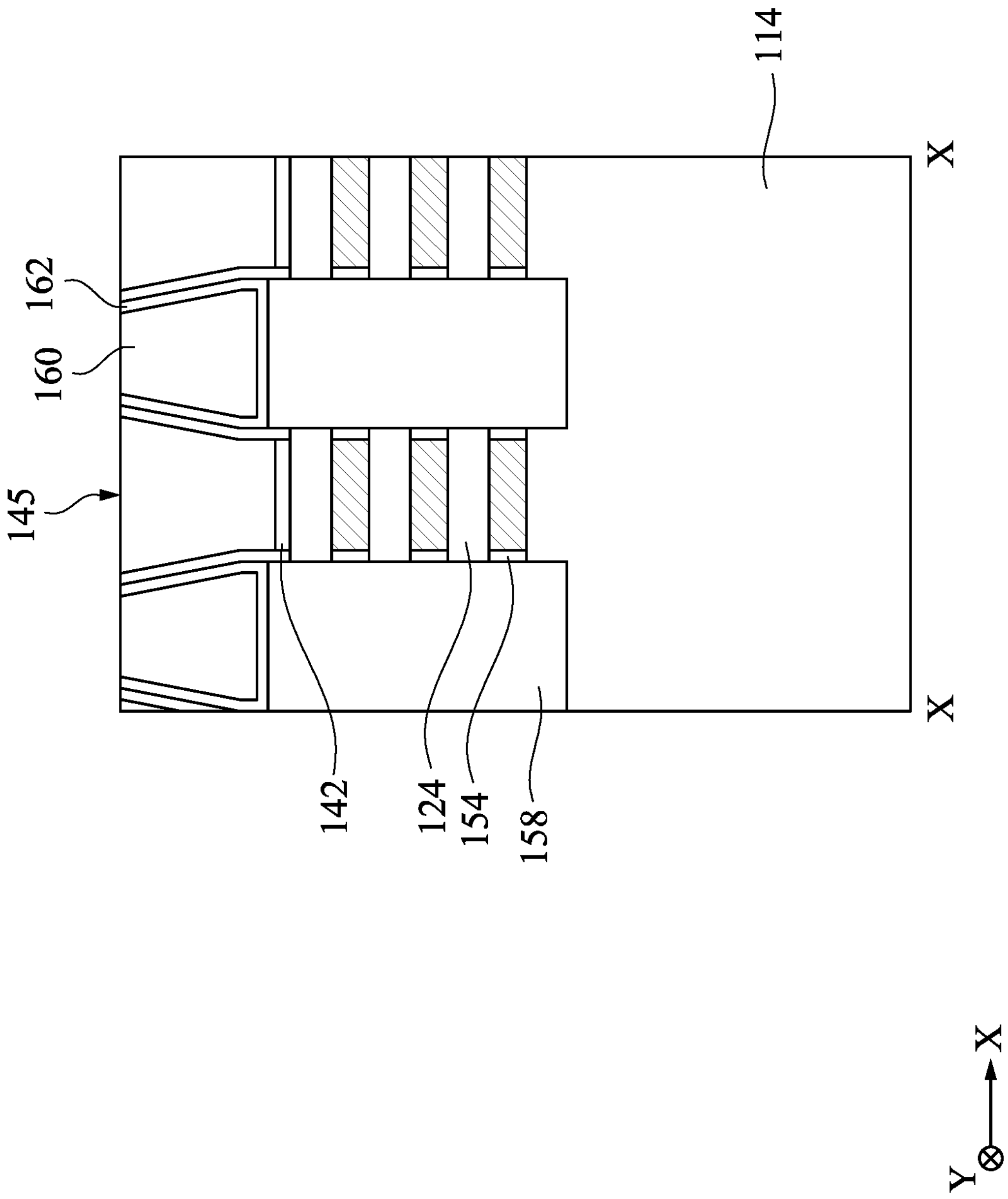

Referring to FIG. 12, an annealing process is performed after forming the ILD layer 160. In some embodiments, the ILD layer 160 is shrunk during the annealing process to provide tensile stress to the dummy gate stack 145 such that a top width of the dummy gate stack 145 becomes broader. In some embodiments, the dummy gate stack 145 has a top width greater than a bottom width of the dummy gate stack 145. A gate trench (see FIG. 13D) can thus have a top width W1 and a bottom width W2 different from the top width W1. For example, the top width W1 is greater than the bottom width W2 such that a process window is enlarged during formation of a subsequent gate contact.

The gate spacers 148 are separated in the x-axis. FIG. 13B is a perspective cross-sectional view showing a cross-sectional view cutting along line X1'-X1' of FIG. 13A. FIG. 13C is a cross-sectional view cutting along line Y1-Y1 of FIG. 13B. FIG. 13D is a cross-sectional view cutting along line X1-X1 of FIG. 13B. In FIGS. 13A-13D, the dummy gate stacks 145 (i.e., the dummy gate electrode 144 and the dummy gate dielectric 142) are removed in one or more etching steps, so that gate trenches 164 are formed between corresponding gate spacers 148. In some embodiments, the dummy gate stacks 145 are removed by an anisotropic dry etch process. For example, the etching process may include a dry etch process using reaction gas(es) that selectively etch the dummy gate at a faster rate than the ILD layer 160. Each gate trench 164 exposes and/or overlies portions of nanostructures 116, which act as channel regions in subsequently completed GAA-FETs. The nanostructures 116 which act as the channel regions are disposed between neighboring pairs of the epitaxial source/drain regions 158. During the removal, the topmost second nanostructures 124*a* may be used as etch stop layers when the dummy gate stacks 145 are etched.

Figure 13A:
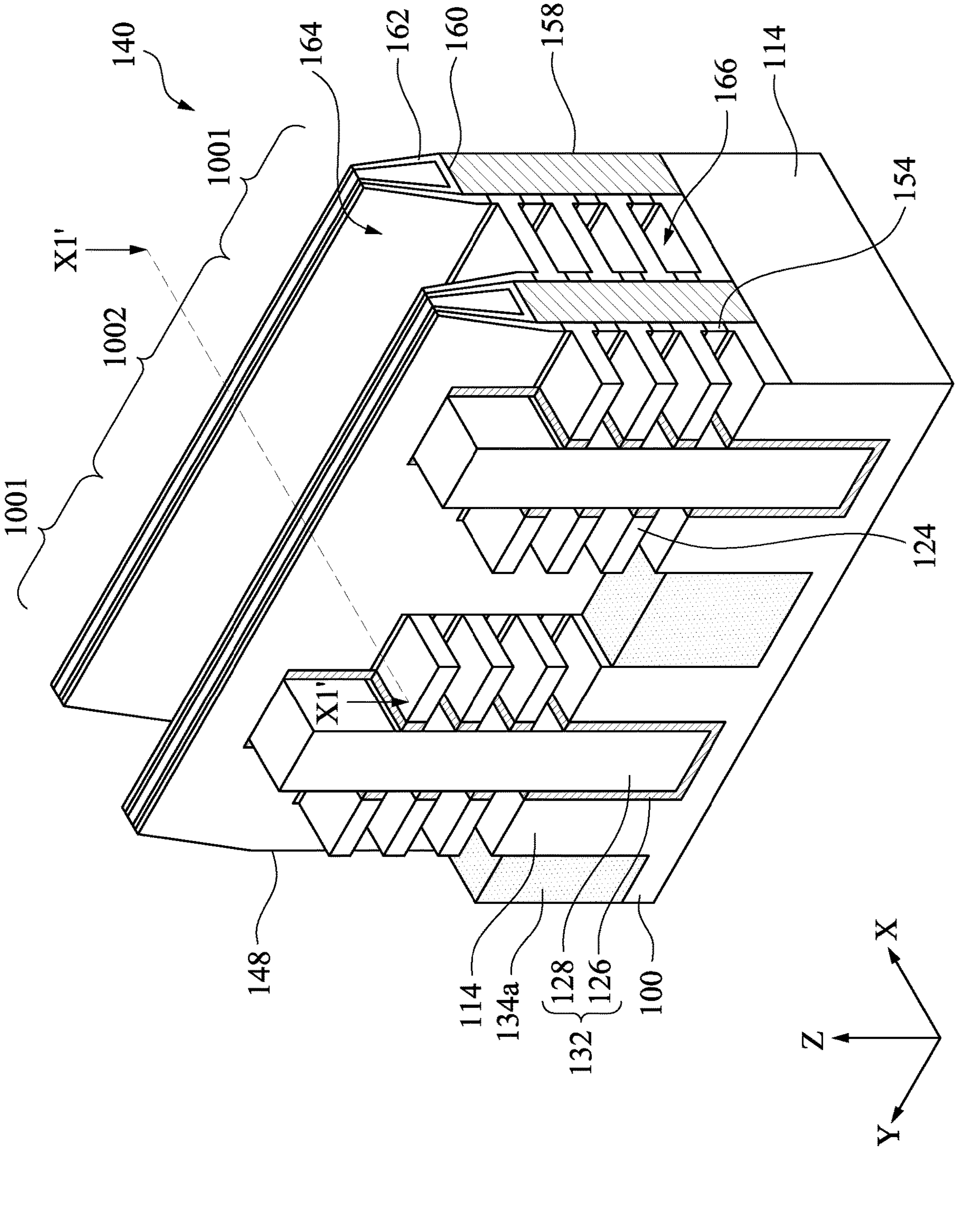
FIG. 13A is perspective view of a method of manufacturing a semiconductor device at various stages in accordance with some embodiments.
Figure 13B:
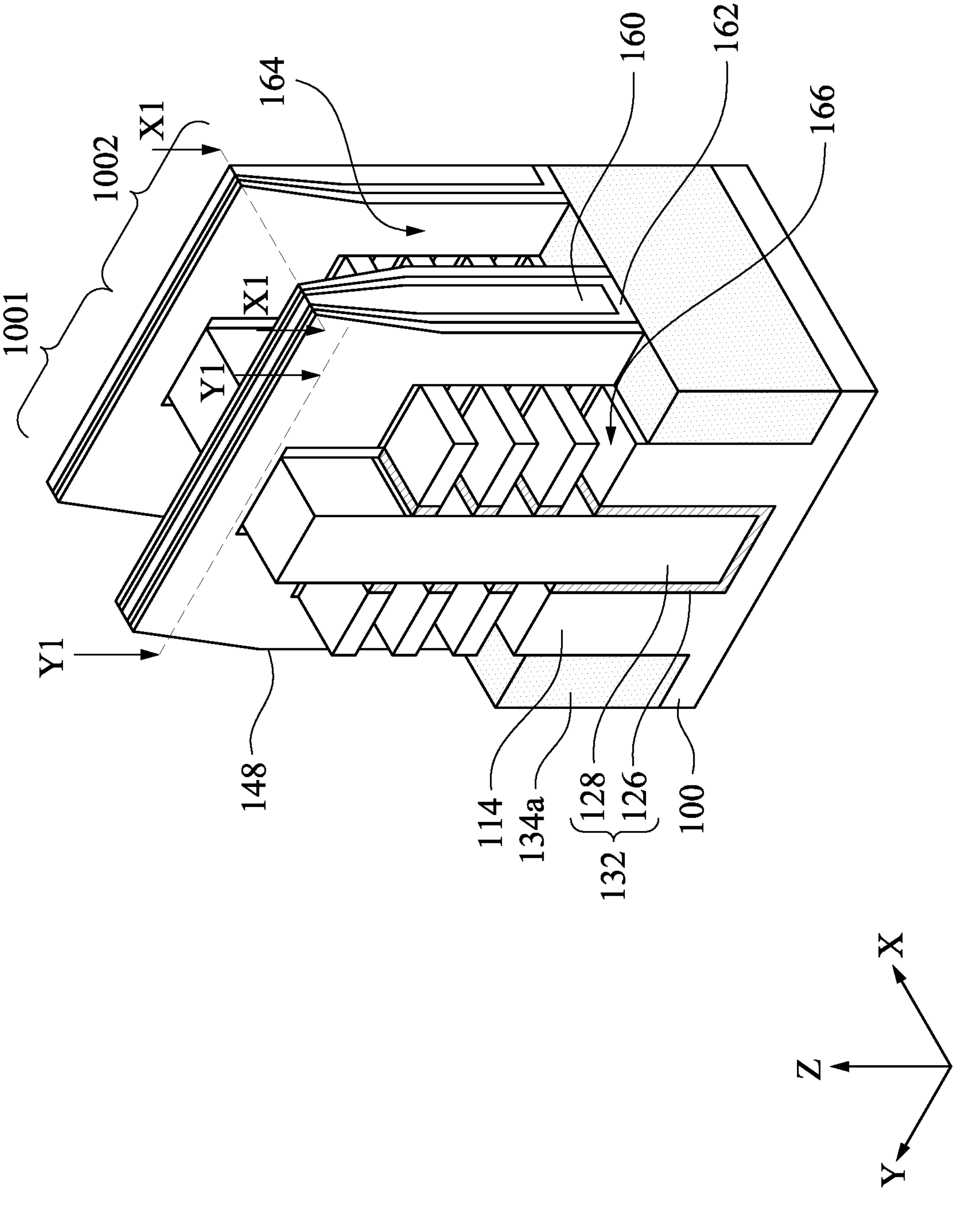
FIG. 13B is a perspective cross-sectional view showing a cross-sectional view cutting along line X1'-X1' of FIG. 13A.
Figure 13D:
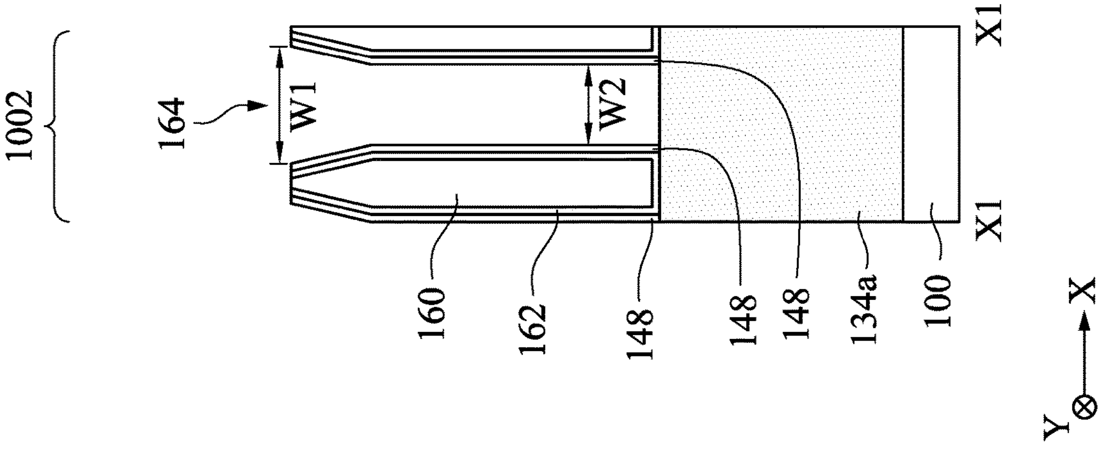
FIG. 13D is a cross-sectional view cutting along line X1-X1 of FIG. 13B.
Figure 13C:
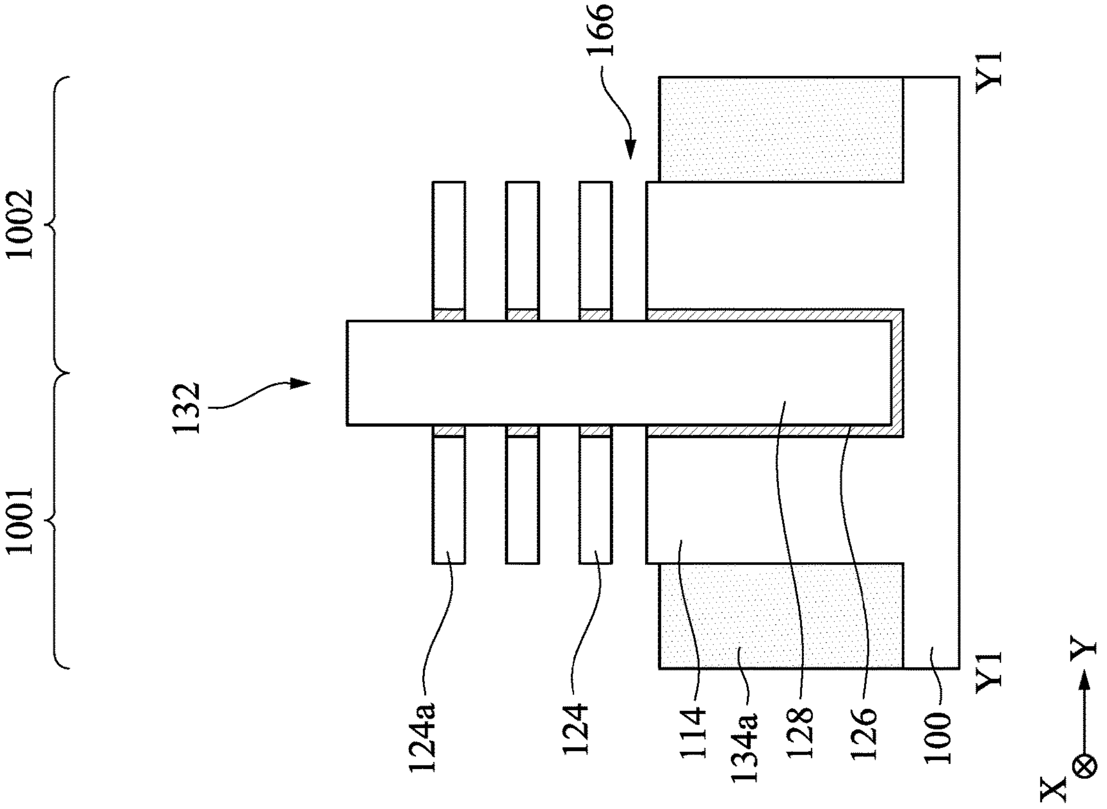
FIG. 13C is a cross-sectional view cutting along line Y1-Y1 of FIG. 13B.

The first nanostructures 122 in the gate trenches 164 are then removed by an isotropic etching process such as wet etching or the like using etchants which are selective to the materials of the first nanostructures 122. Stated differently, the first nanostructures 122 are removed by using a selective etching process that etches the first nanostructures 122 at a faster etch rate than it etches the second nanostructures 124, thus forming spaces between the second nanostructures 124 (also referred to as sheet-sheet spaces if the nanostructures 124 are nanosheets). This step can be referred to as a channel release process. As illustrated in FIG. 13A, gaps 166 (empty spaces) are formed between the second nanostructures 124. At this interim processing step, the gaps 166 between second nanostructures 124 may be filled with ambient environment conditions (e.g., air, nitrogen, etc.). In some embodiments, the second nanostructures 124 can be referred to as nanosheets, nanowires, nanoslabs, nanorings having nano-scale size (e.g., a few nanometers), depending on their geometry. For example, in some embodiments the second nanostructures 124 may be trimmed to have a substantial rounded shape (i.e., cylindrical) due to the selective etching process for completely removing the first nanostructures 122. In that case, the resultant second nanostructures 124 can be called nanowires.

In embodiments in which the first nanostructures 122 include, e.g., SiGe, and the second nanostructures 124 include, e.g., Si or SiC, tetramethylammonium hydroxide (TMAH), ammonium hydroxide ($NH_4OH$) or the like may be used to remove the first nanostructures 122. In some embodiments, both the channel release step and the previous step of laterally recessing first nanostructures 122 (i.e., the step as illustrated in FIG. 9) use a selective etching process that etches first nanostructures 122 (e.g., SiGe) at a faster etch rate than etching second nanostructures 124 (e.g., Si), and therefore these two steps may use the same etchant chemistry in some embodiments. In this case, the etching time/duration of channel release step is longer than the etching time/duration of the previous step of laterally recessing first nanostructures 122, so as to completely remove the sacrificial nanostructures 122.

The first dielectric film 126 exposed by the gaps 166 are removed such that the second dielectric film 128 is exposed by the gaps 166. The first dielectric film 126 can be removed by an isotropic etching process such as wet etching or the like using etchants which are selective to the materials of the first dielectric film 126. Stated differently, the first dielectric film 126 are removed by using a selective etching process that etches the first dielectric film 126 at a faster etch rate than it etches the second dielectric film 128.

Figure 14B:
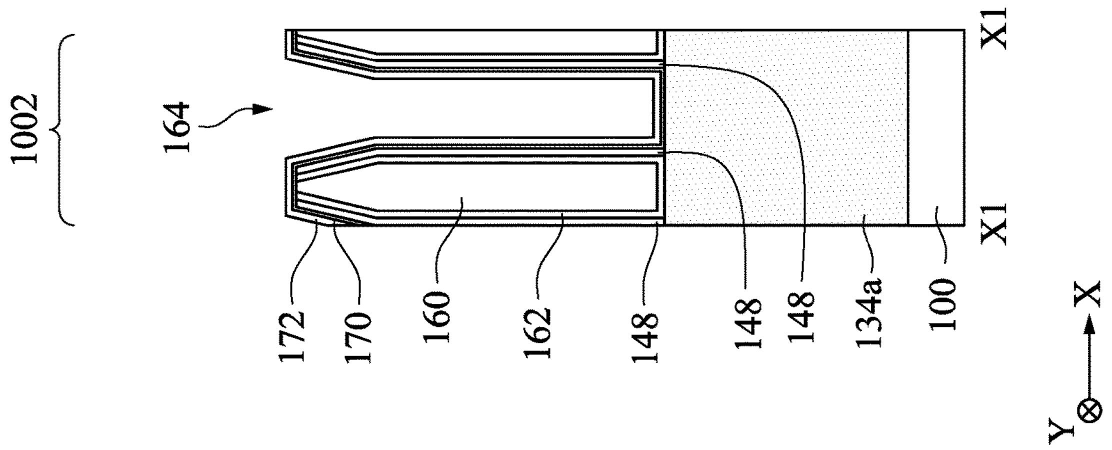
FIGS. 14B, 15B, 15C, 15D, 16B, 17B, 18B, 19B, 20B, 21B, 22B, 23B, and 24B are cross-sectional views cutting along line X1-X1 of FIG. 13B at various stages in accordance with some embodiments.
Figure 14A:
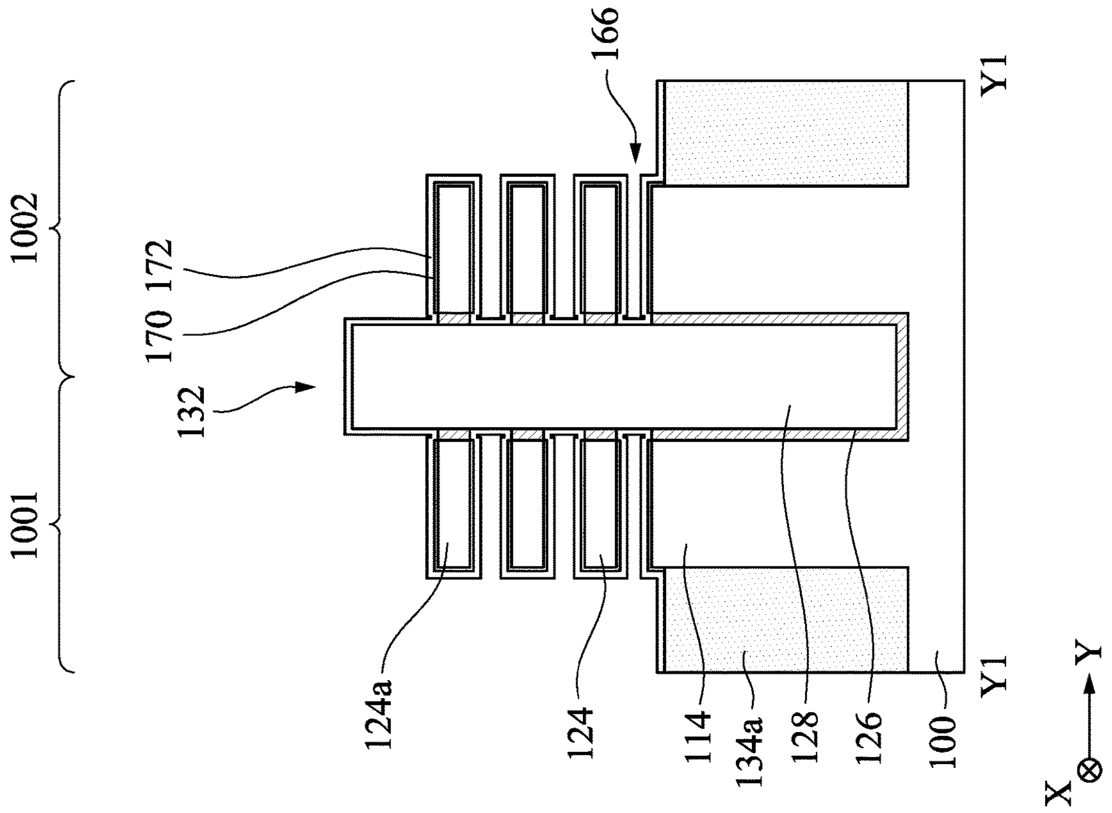
FIGS. 14A, 15A, 16A, 17A, 18A, 19A, 20A, 21A, 22A, 23A and 24A are cross-sectional views cutting along line Y1-Y1 of FIG. 13B at various stages in accordance with some embodiments.

Next, in FIGS. 14A and 14B, a gate dielectric layer 172 is formed (e.g., conformally) in the gate trenches 164 and in the gaps 166. The gate dielectric layer 172 wraps around the second nanostructures 124, lines sidewalls of the inner spacers 154 and sidewalls of the gate spacers 148, and extends along the upper surface of the fin structures 114. In accordance with some embodiments, the gate dielectric layer 172 includes silicon oxide, silicon nitride, or multi-layers thereof. In some embodiments, the gate dielectric layer 172 includes a high-k dielectric material, and in these embodiments, the gate dielectric layer 172 may have a dielectric constant greater than about 7.0, and may include a metal oxide or a silicate of Hf, Al, Zr, La, Mg, Ba, Ti, or Pb, or combinations thereof. The formation methods of the gate dielectric layer 172 may include Molecular-Beam Deposition (MBD), ALD, PECVD, and the like.

In an alternative embodiment, an interfacial layer 170 is deposited between the gate dielectric layer 172 and the second nanostructures 124 and is formed of silicon oxide or silicon oxynitride grown by a thermal oxidation process. For example, the interfacial layer 170 can be grown by a rapid thermal oxidation (RTO) process or by an annealing process using oxygen.

Figure 15A:
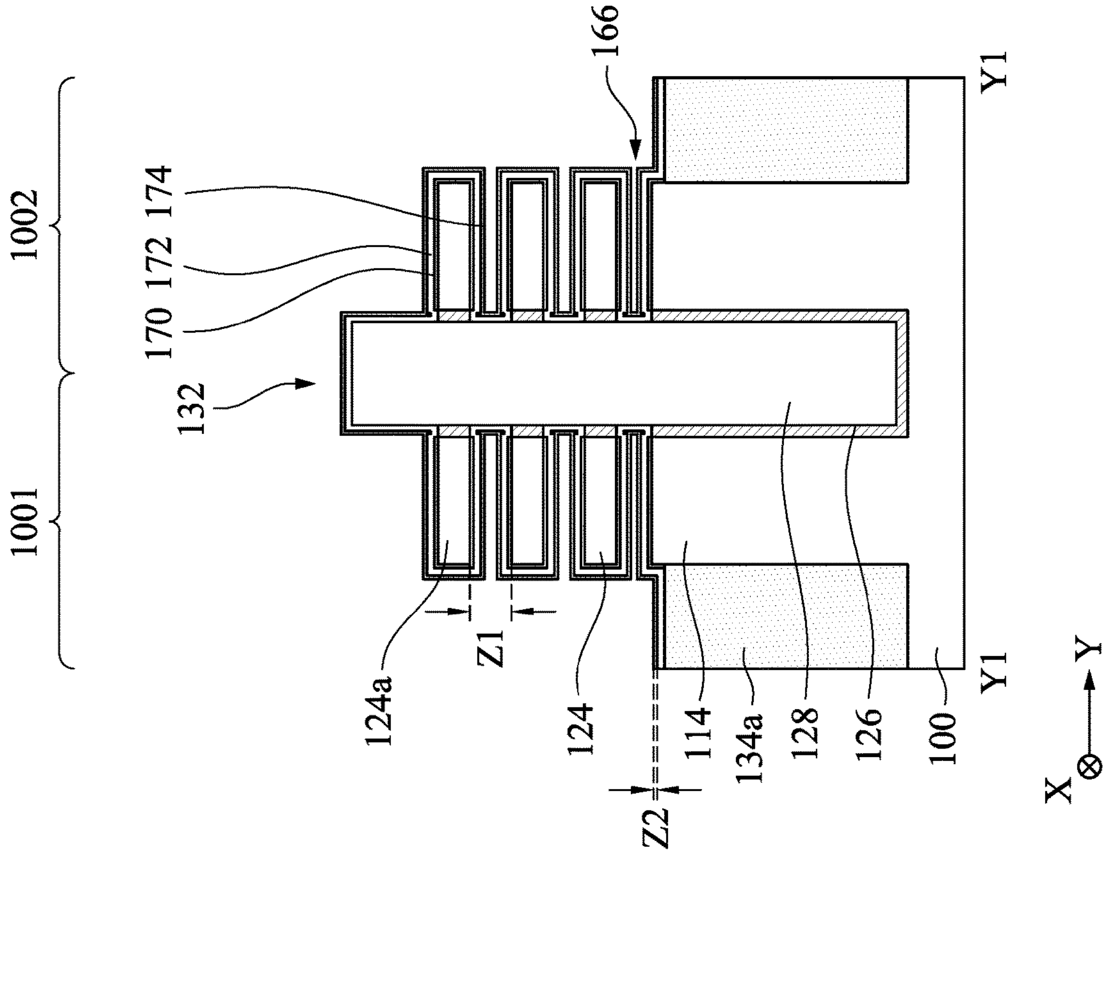
Figure 15B:
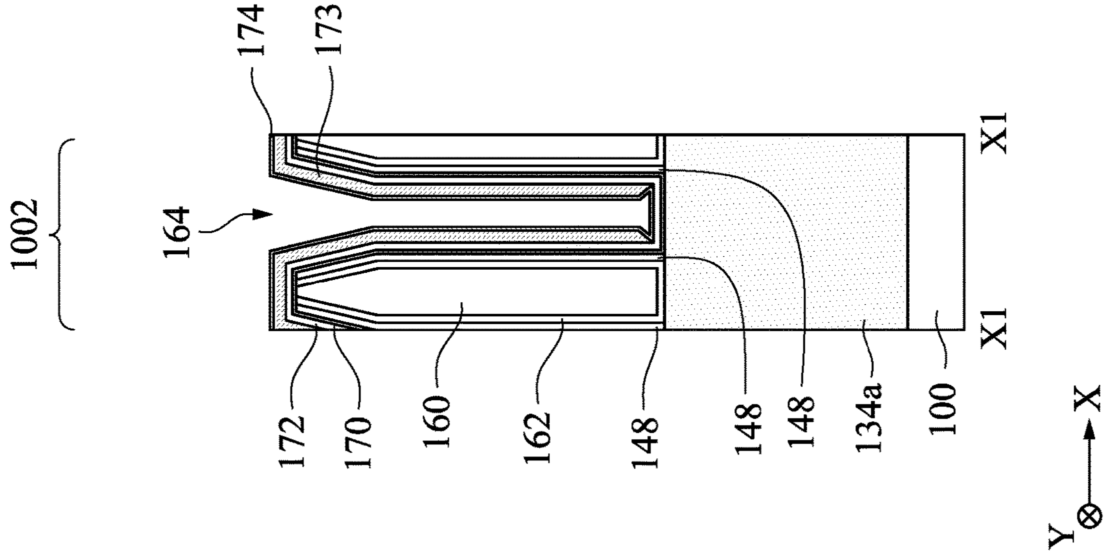

In FIGS. 15A and 15B, a deposition process is performed to form a first p-type work function layer 174 on the gate dielectric layer 172 and in the gate trench 164. For example, the first p-type work function layer 174 is conformally deposited on the gate dielectric layer 172. The first p-type work function layer 174 continuously extends across the gaps 166. In some embodiments, the formation methods of the first p-type work function layer 174 may include ALD, PECVD, or the like. In some embodiments, the first p-type work function layer 174 includes a p-type work function metal (P-metal) that has a work function suitable for PFETs. In some embodiments, the metal suitable for the P-type transistor can be referred to as a p-type work function metal (or P-metal) having a work function higher than the mid-gap work function (about 4.5 eV) that is in the middle of valance band and conduction band of silicon. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The second nanostructures 124 have a sheet-to-sheet spacing Z1 along a vertical direction (e.g., along the z-axis). The first p-type work function layer 174 has a thickness Z2. The thickness Z2 is less than the sheet-to-sheet spacing Z1. For example, the thickness Z2 is much less than a half of the sheet-to-sheet spacing Z1 such that the first p-type work function layer 174 does not merge in the gate trench 164. In other words, the first p-type work function layer 174 has the thickness Z2 less than the vertical distance between the second nanostructures 124.

Figure 15D:
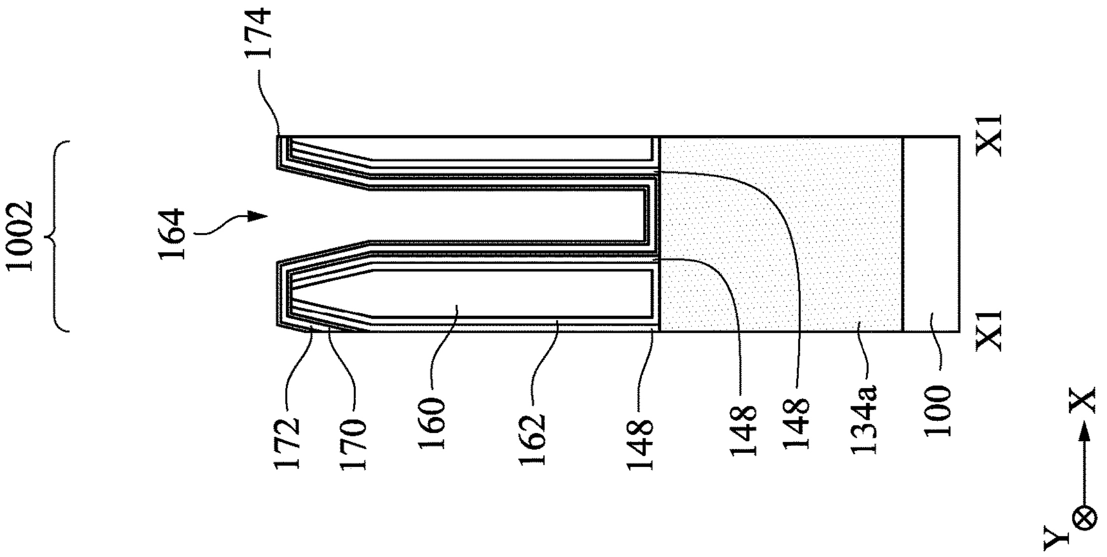
Figure 15C:
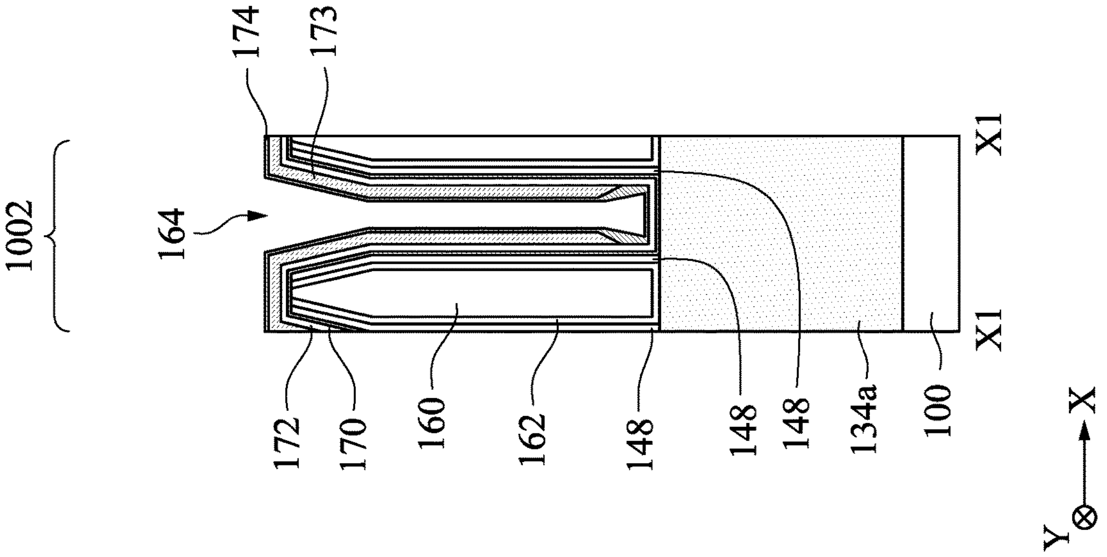

In some embodiments, before the formation of the first p-type work function layer 174, a growth control layer 173 is formed on side surfaces of the gate trench 164 but not on a bottom surface of the gate trench 164. In some embodiments, a patterned photoresist layer (not shown) is formed on the substrate 100, exposing the gate trench 164, and then the growth control layer 173 is formed on the gate trench 164. The growth control layer 173 extends to the bottom surface of the gate trench 164 while the growth control layer 173 may cover only a topmost portion (see FIG. 15C) of the side surfaces of the gate trench 164. The growth control layer 173 affects the deposition rate of a subsequently formed layer (e.g., the first p-type work function layer 174) and may reduce the deposition rate on the side surfaces of the gate trench 164, so that a conformal deposition technique fills a bottom of the recess faster than a top of the gate trench 164. The growth control layer 173 may include any suitable metal, metal oxide, metal carbide, metal nitride, and/or combinations thereof. The growth control layer 173 may be formed by ALD, CVD, sputtering and/or other suitable deposition techniques. In some embodiments, a metal component of the growth control layer 173 is deposited via ALD and a subsequent plasma treatment is performed using a nitrogen-containing and/or carbon-containing gas to form a metal nitride and/or metal carbide. Deposition may be followed by an anisotropic etching process to remove any deposited material from the bottom surface of the gate trench 164. For example, in an embodiment, the growth control layer 173 is deposited by sputtering followed by an anisotropic dry etch that targets deposited material on the bottom surface of the gate trench 164. After the growth control layer 173 is formed, the patterned photoresist layer (not shown) may be removed by an ash process. Referring to FIG. 15D, in some other embodiments, the growth control layer 173 is absent in the gate trench 164, and the first p-type work function layer 174 is in contact with on the gate dielectric layer 172.

Figure 16B:
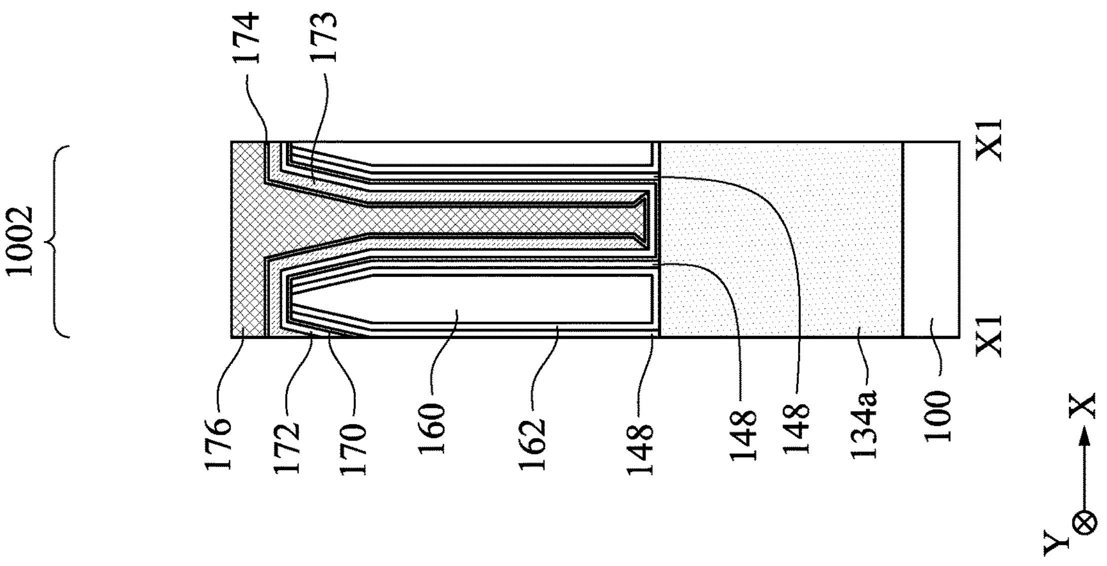
Figure 16A:
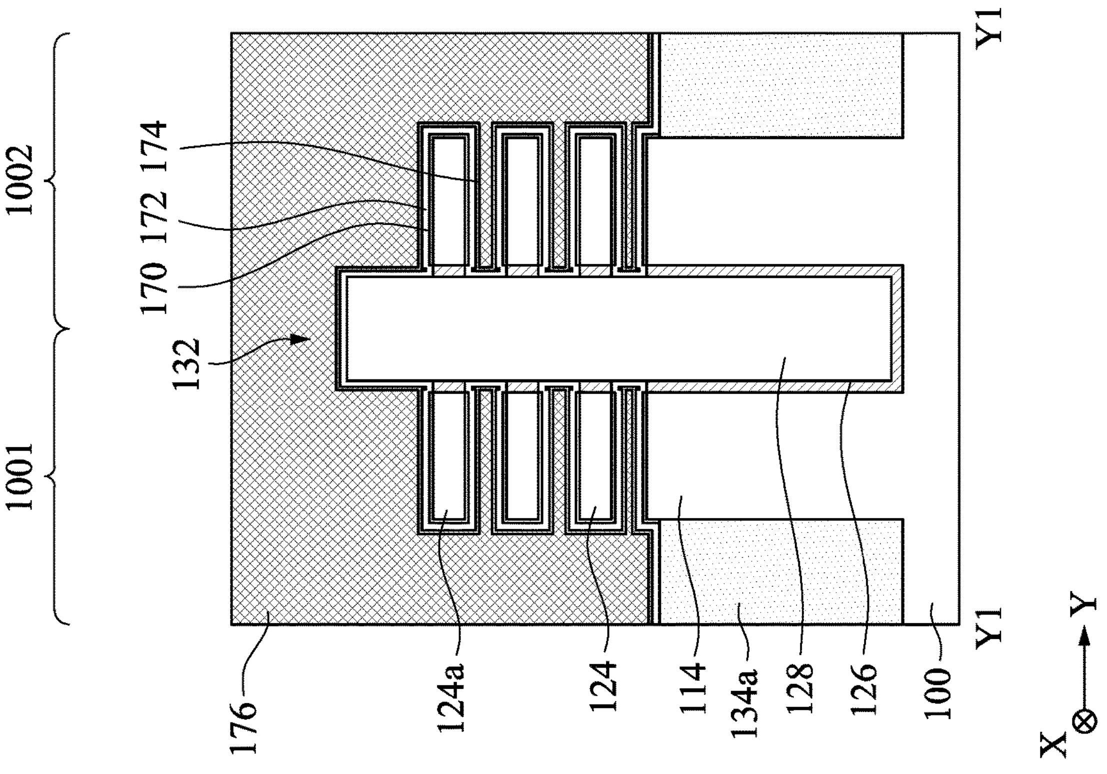

Reference is made to FIGS. 16A and 16B. A bottom anti-reflective coating (BARC) layer 176 is formed on the first p-type work function layer 174. For example, the BARC layer 176 fills into the gaps 166 and the gate trench 164 and covers the STI regions 134*a*, the dielectric fin 132, the gate spacers 148, the CESL 162 and the ILD layer 160.

The BARC layer 176 is an organic BARC layer formed using a spinning coating technique. In other words, the BARC layer 176 is formed between the two neighboring second nanostructures 124.

Figure 17B:
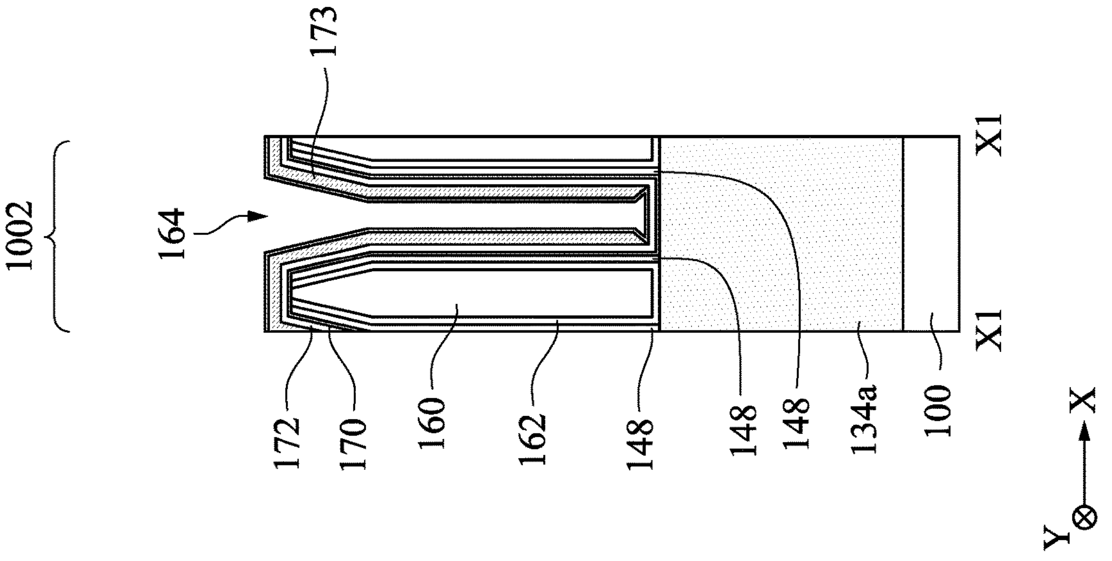
Figure 17A:
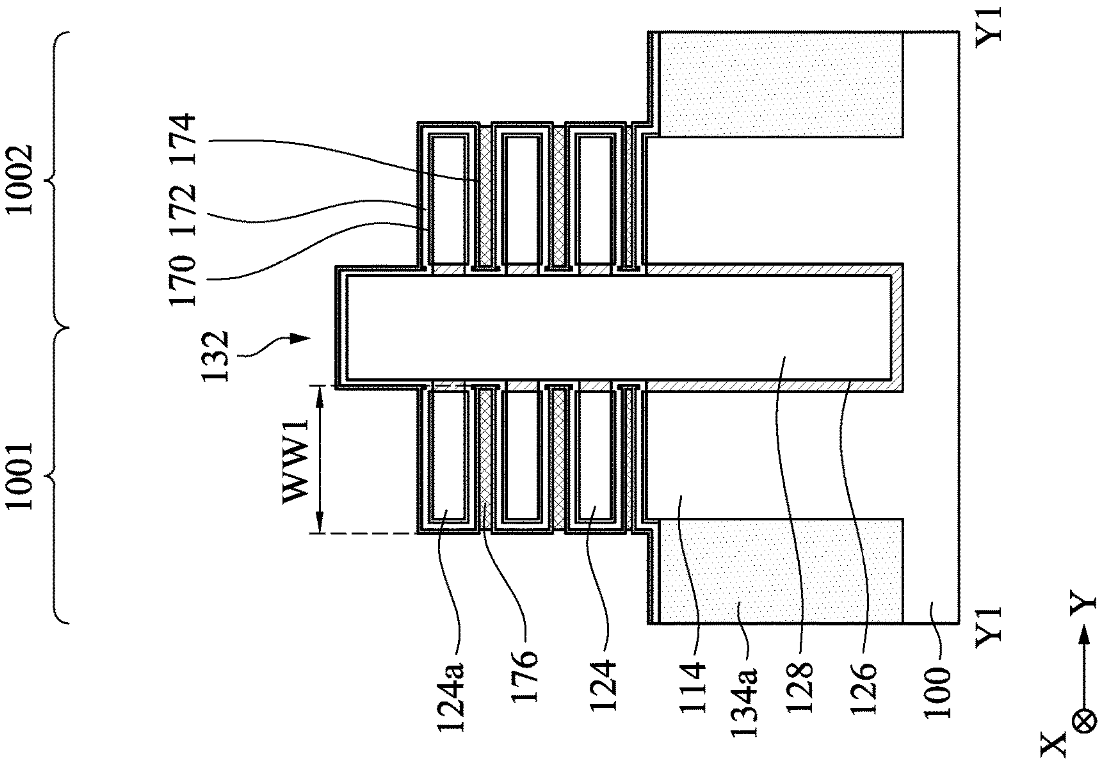

Reference is made to FIGS. 17A and 17B. The BARC layer 176 is etched back to expose the first p-type work function layer 174, while leaving portions of the BARC layer 176 within the gaps each between adjacent two of the second nanostructures 124. The BARC layer 176 is etched back by an anisotropic etch process such as using etchants including $N_2$, $H_2$, or a combination thereof, such that a portion of the BARC layer 176 in the gate trench 164 is removed while a portion of the BARC layer 176 vertically between the two neighboring second nanostructures 124 and the bottommost one of the second nanostructures 124 and the fin structure 114 remains. Due to etching back the BARC layer 176 using the anisotropic etch process, no BARC layer 176 remains in the gate trench 164. The first p-type work function layer 174 is thus exposed by the gate trench 164 after etching back the BARC layer 176. The first p-type work function layer 174 overlapping the second nanostructures 124 has a width WW1 along the y-axis. The BARC layer 176 has a different etch selectivity than the first p-type work function layer 174. Therefore, the first p-type work function layer 174 remains intact after etching back the BARC layer 176.

Figure 18B:
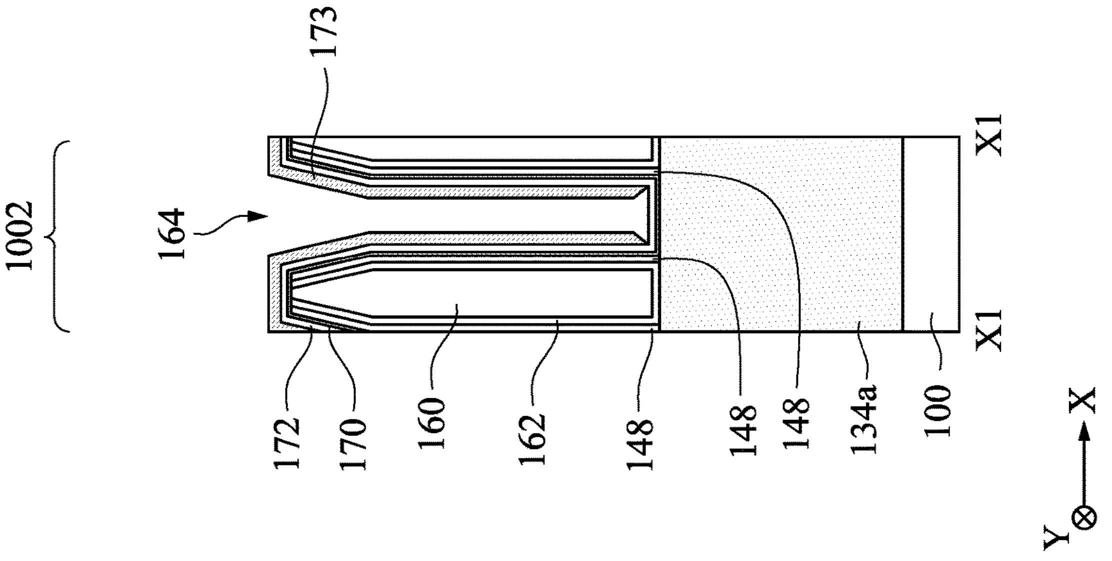
Figure 18A:
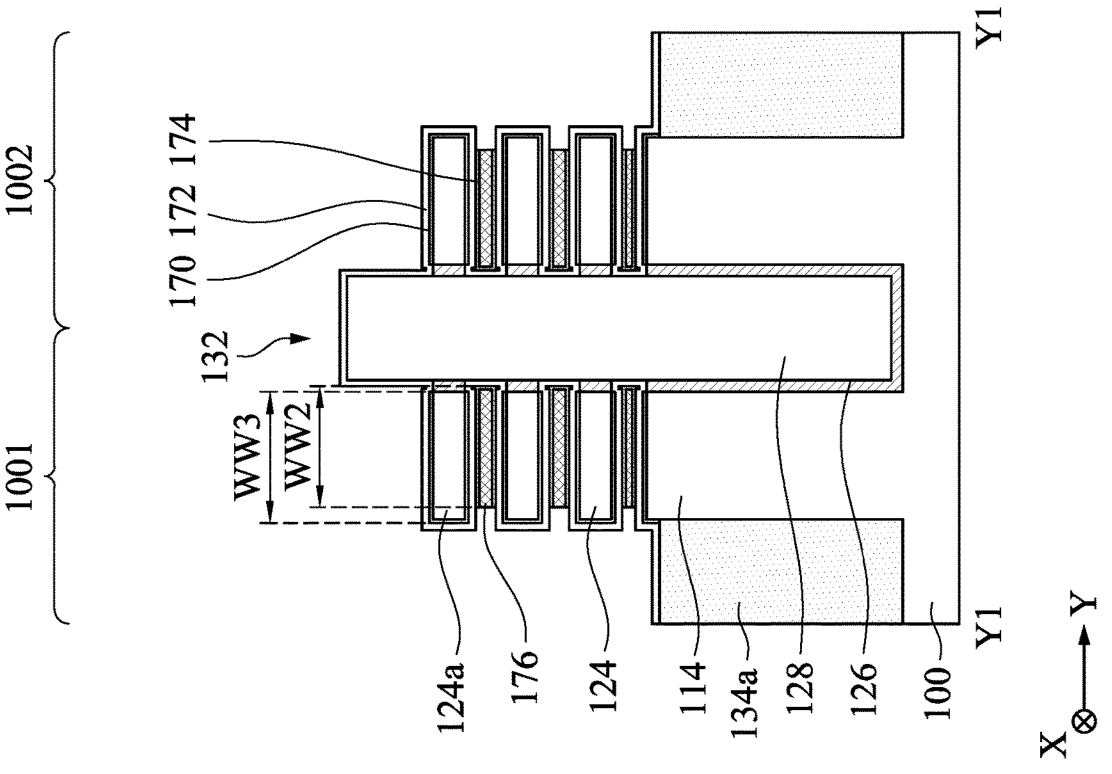

Reference is made to FIGS. 18A and 18B. After etching back the BARC layer 176, the first p-type work function layer 174 is etched by an isotropic etch process such as using a wet etch, exposing a portion of the gate dielectric layer 172. The first p-type work function layer 174 is etched to be broken into separate first p-type work function sublayers respectively confined within the gaps each between adjacent two of the second nanostructures 124. The isotropic etch process removes portions of the first p-type work function layer 174 from sidewalls of the second nanostructures 124. Due to the wet etch, the first p-type work function layer 174 has a reduced width along the y-axis. For example, the etched first p-type work function layer 174 has a width WW2 less than the width WW1. The second nanostructures 124 each have a width WW3 greater than the width WW2 of the first p-type work function layer 174. A portion of the first p-type work function layer 174 in the gate trench 164 and over the gate spacers 148, the CESL 162 and the ILD layer 160, a portion of the first p-type work function layer 174 extending along sidewalls of the second nanostructures 124, on the top surface of the topmost second nanostructure 124*a* and extending along a sidewall and over a top surface of the dielectric fin 132, and a portion of the first p-type work function layer 174 extending along the STI region 134*a* are removed. The growth control layer 173 is thus exposed by the gate trench 164 after etching the first p-type work function layer 174. That is, the first p-type work function layer 174 is absent in the gate trench 164. A portion of the first p-type work function layer 174 between the two neighboring second nanostructures 124 and the bottommost one of the second nanostructures 124 and the fin structure 114 remains.

Figure 19B:
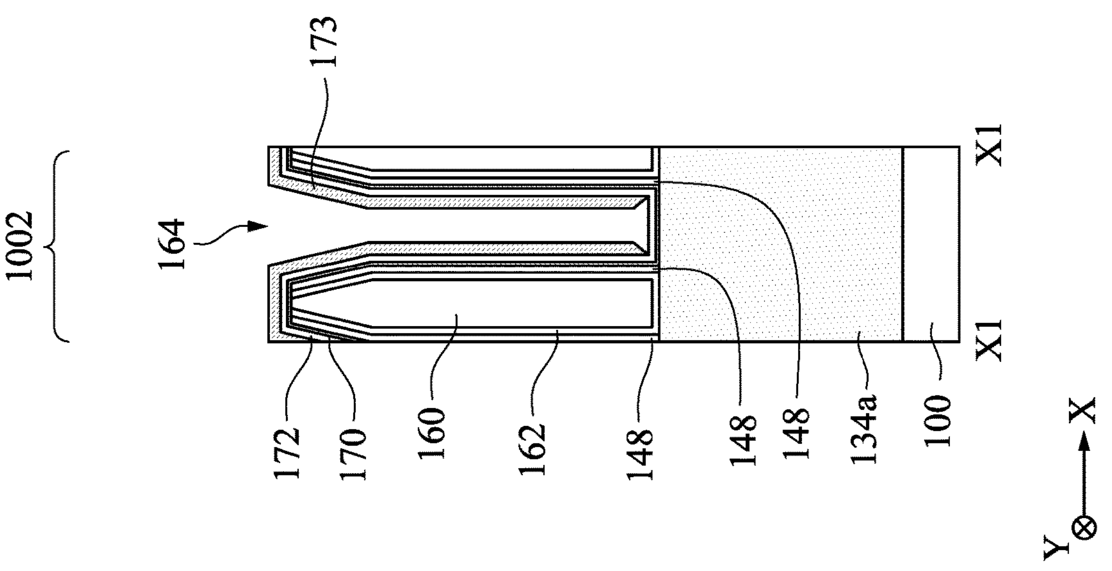
Figure 19A:
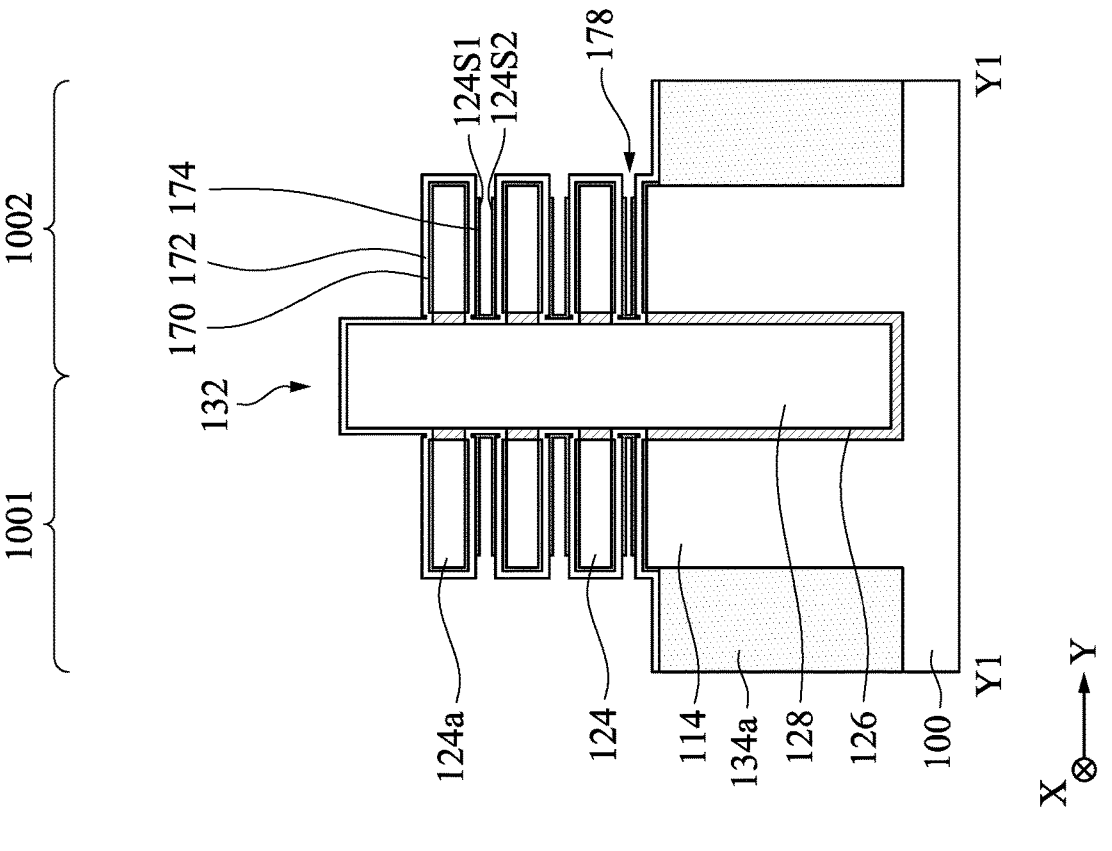

Reference is made to FIGS. 19A and 19B. The BARC layer 176 is removed by implementing a plasma ashing. For example, an oxygen plasma ashing may be implemented to remove the BARC layer 176 between the two neighboring second nanostructures 124, and gaps (empty spaces) 178 are formed between the first p-type work function layer 174 on the two neighboring second nanostructures 124. Due to the present of the first p-type work function layer 174 in the sheet-to-sheet spacing (i.e., between the two neighboring second nanostructures 124 and between the bottommost one of the second nanostructure 124 and the fin structure 114), the gaps 178 is narrower than the gaps 166 (see FIG. 14A) along the z-axis. The first p-type work function layer 174 has opposite surfaces 124S1, 124S2 facing each other.

Figure 20B:
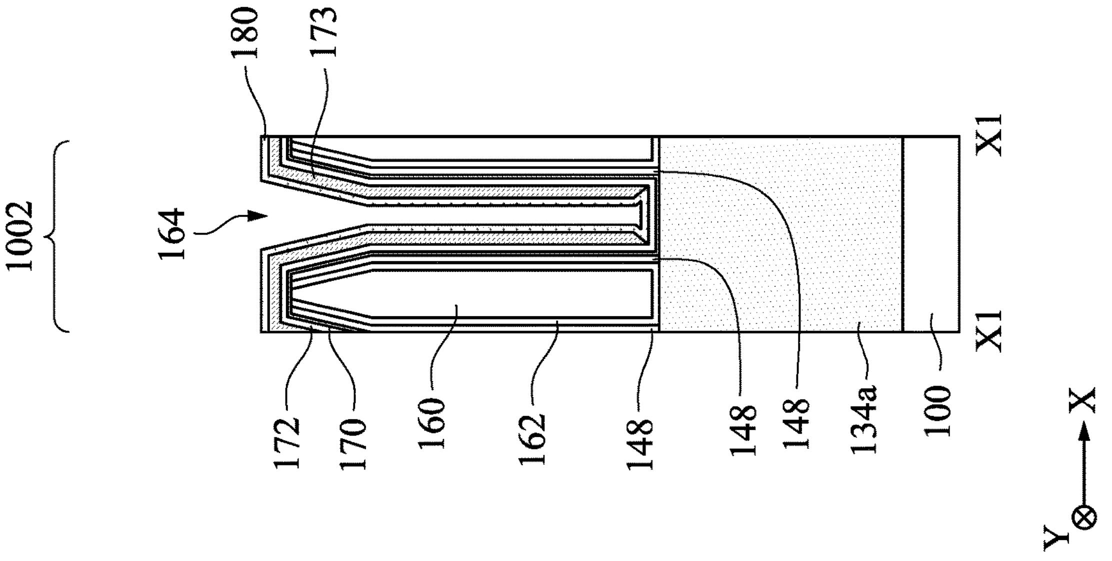
Figure 20A:
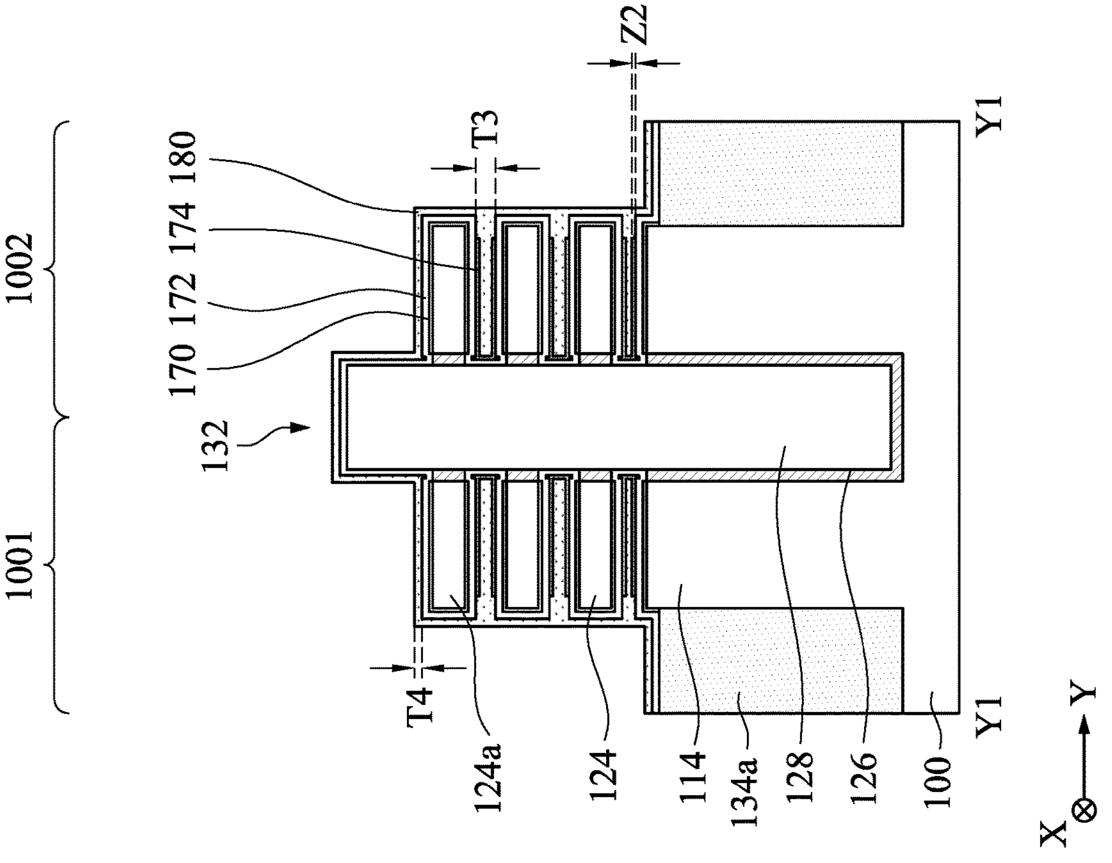

Reference is made to FIGS. 20A and 20B. A second p-type work function layer 180 is formed on the structure in FIGS. 19A and 19B. For example, the second p-type work function layer 180 is conformally formed in the gate trench 164, fills into the gaps 178, extending along the sidewall of the dielectric fin 132, covers the top surface of the dielectric fin 132, extending along the sidewall of the second nanostructures 124, and extending along the top surface of the STI region 134*a*. The second p-type work function layer 180 is formed across the first p-type work function layer 174. In some embodiments, the formation methods of the second p-type work function layer 180 may include ALD, PECVD, or the like. The second p-type work function layer 180 has opposite sidewalls 180S1, 180S2 facing each other. Since the sheet-to-sheet spacing (i.e., the gaps 178) is narrowed by the first p-type work function layer 174, the second p-type work function layer 180 with a reduced thickness T4 is capable of filling the gaps 178.

The reduced thickness T4 is small enough such that the second p-type work function layer 180 would not merge in the gate trench 164, allowing for a subsequent n-type work function layer formed into the gate trench 164. Therefore, a process window along the x-axis is enlarged during formation of the subsequent n-type work function layer. Therefore, a threshold voltage shift or a localized threshold voltage mismatch issue caused by merging of the second p-type work function layer 180 along the x-axis can be prevented, which is beneficial for controlling a uniformity of a local threshold voltage. The p-type work function metal thus has an improved thickness design flexibility. The second p-type work function layer 180 has the thickness T4 less than the vertical distance between the second nanostructures 124. For example, the thickness T4 can be less than the sheet-to-sheet spacing Z1 (see FIG. 15A). In some embodiments, the thickness T4 is much less than a half of the sheet-to-sheet spacing Z1. Depending on the sheet-to-sheet spacing Z1 (see FIG. 15A) and the critical dimension (CD) of the poly gate (i.e., the gate trench 164), the thickness T4 of the second p-type work function layer 180 and the thickness Z2 of the first p-type work function layer 174 can be different from or same as each other.

In some embodiments, the second p-type work function layer 180 includes a p-type work function metal (P-metal). The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Depending on a desired threshold voltage for the high-k/metal gate structure in the p-type region 1002, the first p-type work function layer 174 can have a material same as or different from a material of the second p-type work function layer 180. In some embodiments, the second p-type work function layer 180 includes the material same as the material of the first p-type work function layer 174. In some other embodiments, the second p-type work function layer 180 includes the material different from the material of the first p-type work function layer 174. As discussed previously, the first p-type work function layer 174 (see FIG. 17B) is absent in the P-metal in the gate trench 164. In some embodiments where the first p-type work function layer 174 and the second p-type work function layer 180 include the same material, while no observable interface is present between the first p-type work function layer 174 and the second p-type work function layer 180, a sum of a thickness T3 of the P-metal between sheet-to-sheet (i.e., a sum of the thickness Z2 of the first p-type work function layer 174 and the thickness T4 of the second p-type work function layer 180) is greater than a thickness T4 of the P-metal within the gate trench 164 and greater than the thickness Z2 of the first p-type work function layer 174. The P-metal above the topmost one of the second nanostructures 124 (i.e., the topmost second nanostructure 124*a*) is free of the first p-type work function layer 174. As a result, in FIG. 20A, the P-metal has the thickness T4 along the z-axis above the topmost one of the second nanostructures 124 and the thickness T3 along the z-axis between the two neighboring two of the second nanostructures 124. The thickness T4 is less than the thickness T3.

Figure 21B:
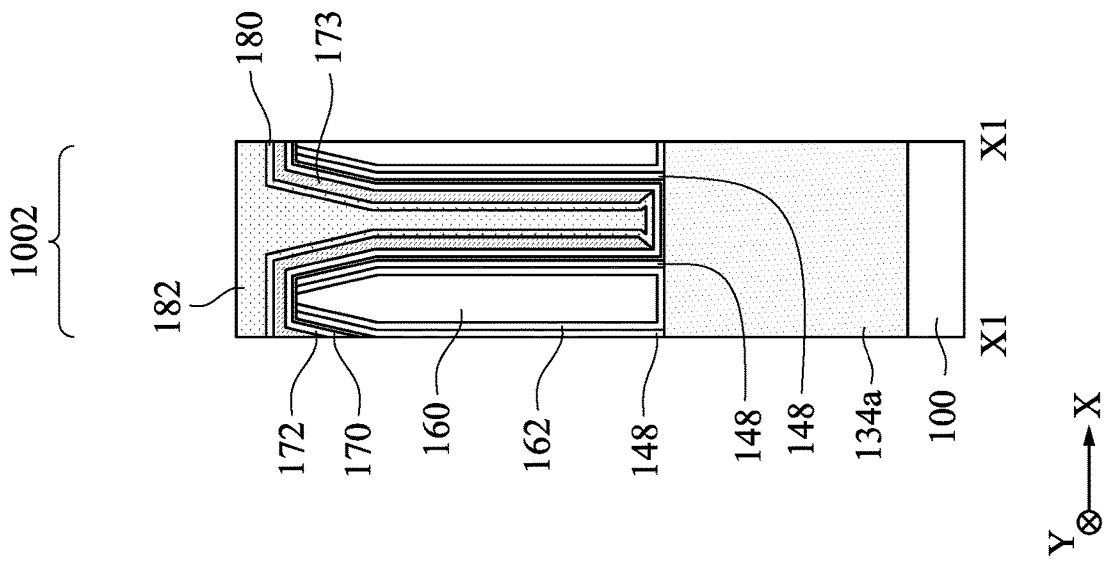
Figure 21A:
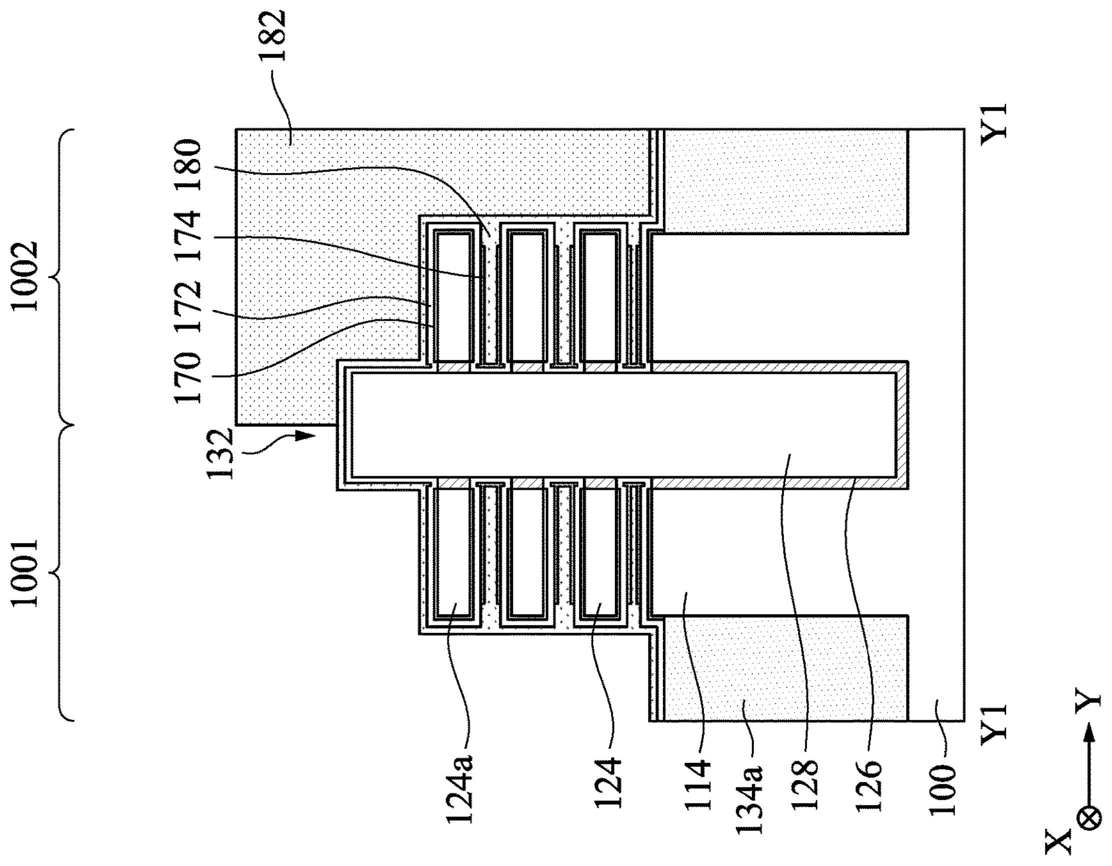

Reference is made to FIGS. 21A and 21B. A photoresist layer 182 is then formed over the second p-type work function layer 180 and patterned to expose the structure (i.e., second p-type work function layer 180 and the underlying dielectric fin 132 and the second nanostructures 124) in the n-type region 1001. In some embodiments, the photoresist layer 182 is an organic material formed using a spin-on coating process, followed by patterning the organic material using suitable lithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

Figure 22B:
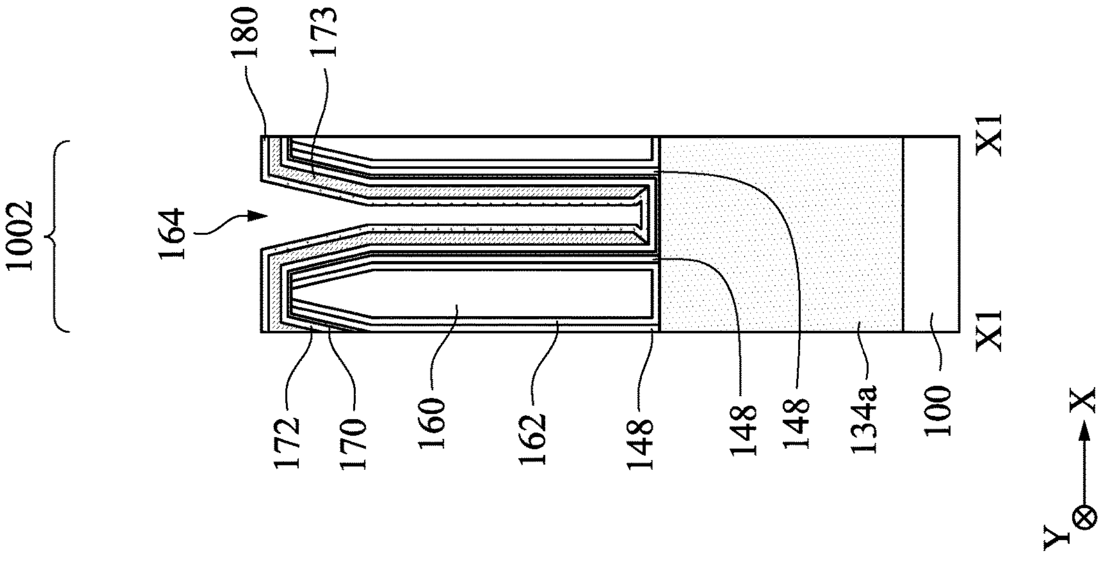
Figure 22A:
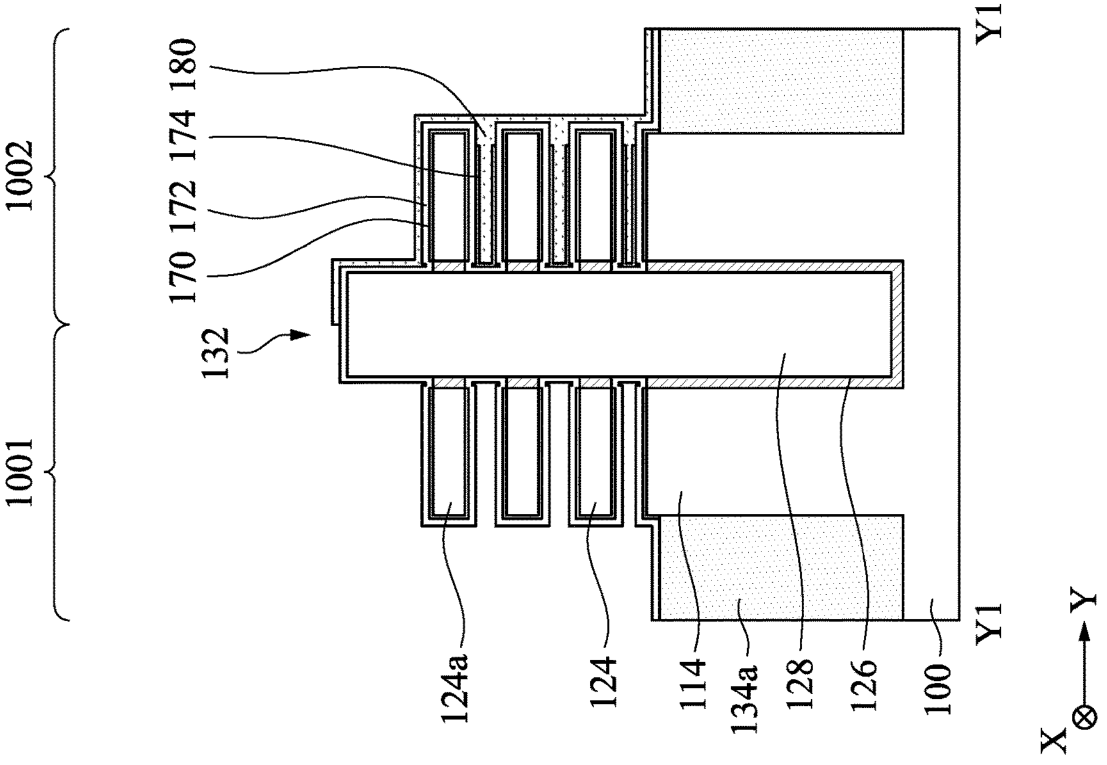

After the patterned photoresist layer 182 is formed, the exposed second p-type work function layer 180 in the n-type region 1001 and the underlying first p-type work function layer 174 are removed by using the patterned photoresist layer 182 as an etch mask, so that the gate dielectric layer 172 is exposed in the n-type region 1001. In some embodiments, the second p-type work function layer 180 and the first p-type work function layer 174 are removed by a plasma dry etching using fluorine-based and/or chlorine-based etchants. For example, the second p-type work function layer 180 and the first p-type work function layer 174 may be removed by a wet etching process using an etchant that is selective to the material of the gate dielectric layer 172. Stated differently, the etchant used in removing the second p-type work function layer 180 and the first p-type work function layer 174 etches the material of the second p-type work function layer and the first p-type work function layer 174 at a faster etch rate than etching the material of the gate dielectric layer 172. The resulting structure is shown in FIGS. 22A and 22B.

Figure 23A:
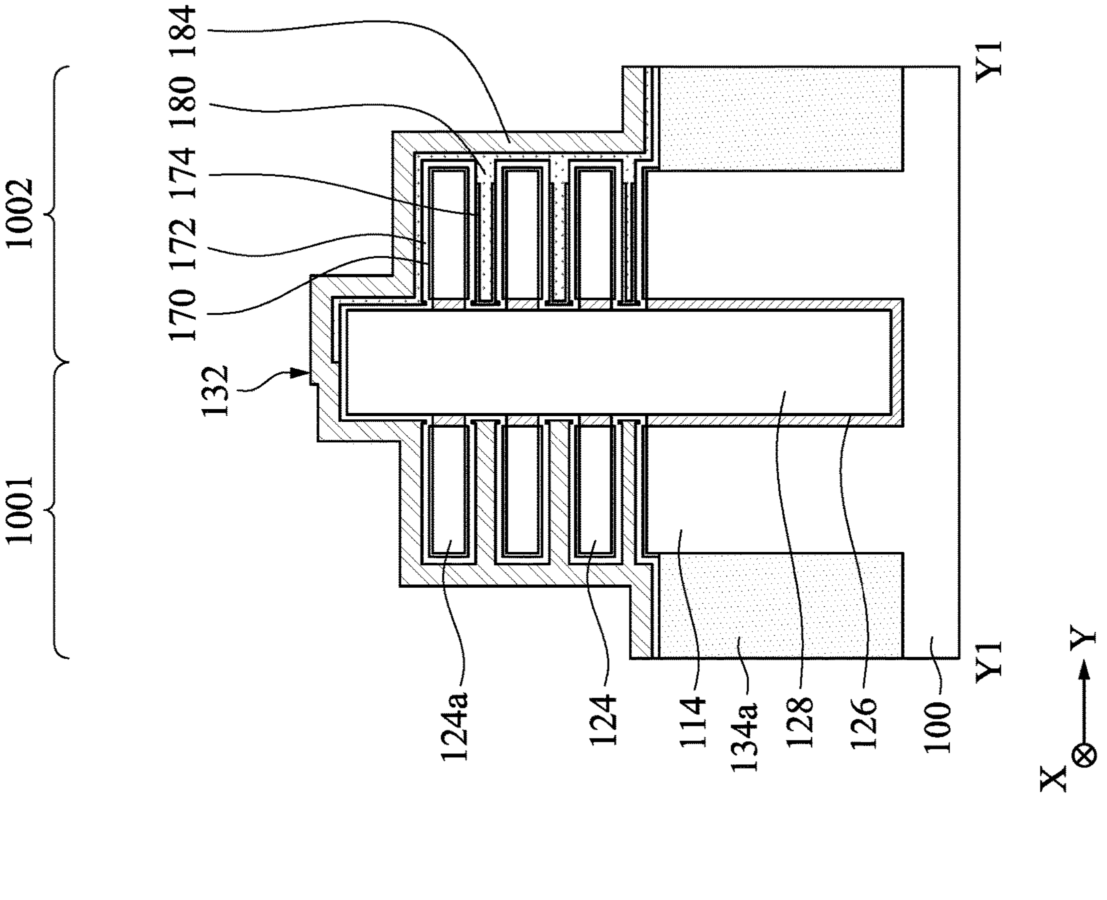
Figure 23B:
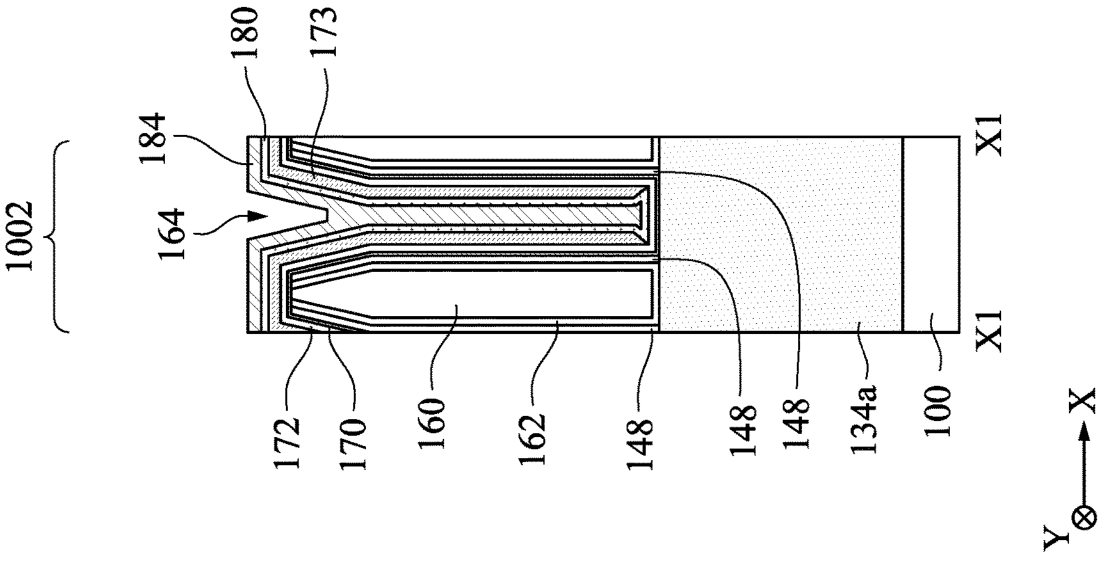

Reference is made to FIGS. 23A and 23B. One or more n-type work function layers 184 are deposited on the gate dielectric layer 172 in the n-type region 1001 and on the second p-type work function layer 180 in the p-type region 1002. The one or more n-type work function layers 184 fill the gaps 166 in the n-type region 1001. The one or more n-type work function layers 184 are formed between the opposite sidewalls 180S1, 180S2 of the second p-type work function layer 180 in the gate trench 164. The one or more n-type work function layers 184 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials.

Figure 24B:
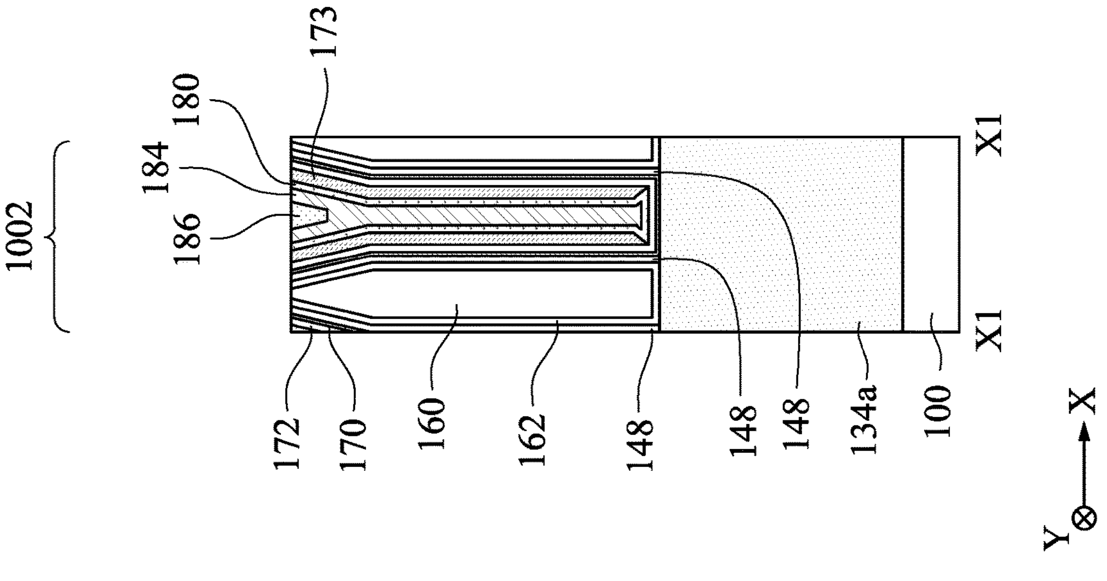
Figure 24A:
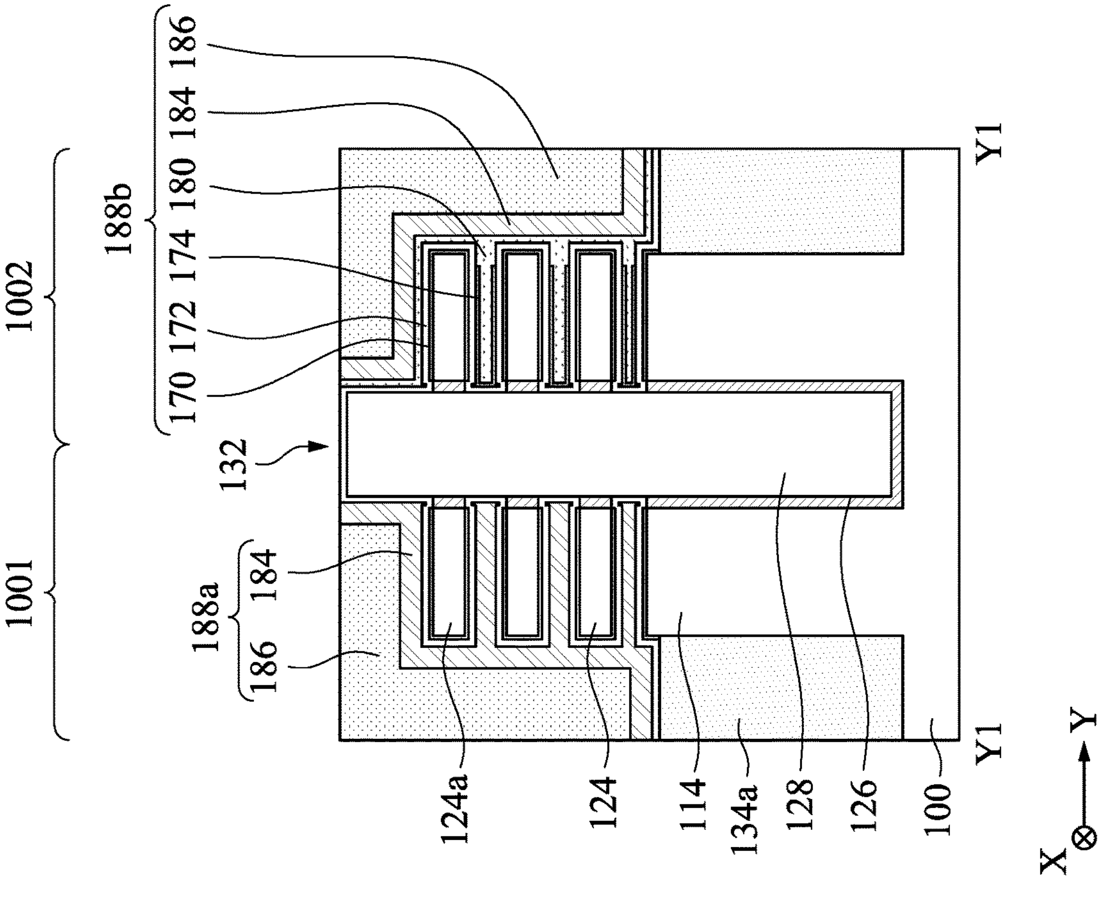

In FIGS. 24A and 24B, a fill metal 186 is formed on the one or more n-type work function layers 184 and fills a reminder of the gate trench 164. A CMP is then performed on the fill metal 186 until the ILD layer 160, the CESL 162 and the gate spacers 148 are exposed, resulting in the fill metal 186, the one or more n-type work function layers 184, the second p-type work function layer 180, the ILD layer 160, the CESL 162 and the gate spacers 148 having substantially level top surfaces. In the p-type region 1002, the fill metal 186, the one or more n-type work function layers 184, the second p-type work function layer 180, the first p-type work function layer 174 and the corresponding gate dielectric layer 172 and interfacial layer 170 may be collectively referred to as a gate stack 188*b*. The gate spacers 148 are on opposite sides of the gate stack 188*b*. In the n-type region 1001, the fill metal 186, the one or more n-type work function layers 184, and the corresponding gate dielectric layer 172 and interfacial layer 170 may be collectively referred to as a gate stack 188*a*.

In some embodiments, the fill metal 186 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. Additional processing may be performed to finish fabrication of the device, as one of ordinary skill readily appreciates, thus details may not be repeated here. For example, another inter-layer dielectric (ILD) may be deposited over the ILD layer 160. Further, gate contacts and source/drain contacts may be formed extending through the additional ILD and/or the ILD layer 160 to electrically couple to the gate stacks 188*a*, 188*b* and the epitaxial source/drain regions 158 (see FIG. 11), respectively.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by forming the bottom anti-reflective coating on the forksheet structure followed by the anisotropic etch process and the isotropic etch process, the portion of the first p-type work function layer in the gate trench can be removed while the portion of the p-type work function layer in the sheet-to-sheet spacing remains. Another advantage is that a threshold voltage shift or a localized threshold voltage mismatch issue caused by merging of the second p-type work function layer along the x-axis can be prevented, which is beneficial for controlling a uniformity of a local threshold voltage. Yet another advantage is that the process window along the x-axis is enlarged during formation of the n-type work function layer.

In some embodiments, a semiconductor device includes a plurality of nanostructures over a substrate arranged in a z-axis and a gate stack wrapping around the plurality of nanostructures. Thea gate stack comprises a gate dielectric layer and a p-type work function material on the gate dielectric layer. The gate dielectric layer wraps around the plurality of nanostructures. The p-type work function material has a first thickness along the z-axis above a topmost one of the plurality of nanostructures and a second thickness along the z-axis between neighboring two of the plurality of nanostructures, and the first thickness is less than the second thickness. In some embodiments, the semiconductor device further comprises gate spacers on opposite sides of the gate stack. The gate spacers are separated in an x-axis perpendicular to the z-axis, the p-type work function material has a portion between the gate spacers with a third thickness along the z-axis, and the third thickness is less than the second thickness. In some embodiments, the p-type work function material between the neighboring two of the plurality of nanostructure comprises a first p-type work function layer and a second p-type work function layer on the first p-type work function layer. In some embodiments, the p-type work function material above the topmost one of the plurality of nanostructures is free of the first p-type work function layer. In some embodiments, in a y-axis perpendicular to the x-axis, the plurality of nanostructures each have a width greater than a width of the first p-type work function layer. In some embodiments, the second p-type work function layer has a material different from a material of the first p-type work function layer.

In some embodiments, a method of forming a semiconductor device includes the following steps. Fins are formed protruding from a substrate. Each of the fins has alternating stacked first nanostructures and second nanostructures. A dielectric fin is formed on a first side of one of the fins. An insulation material is formed on a second side of the one of the fins opposite to the first side. The first nanostructures are removed to form gaps each between adjacent two of the second nanostructures. A first p-type work function layer is formed continuously extending across the gaps. The first p-type work function layer is etched to break the first p-type work function layer into separate first p-type work function sublayers respectively confined within the gaps. A second p-type work function layer is formed across the first p-type work function sublayers. In some embodiments, the method further includes forming a bottom anti-reflection coating (BARC) layer on the first p-type work function layer and etching back the BARC layer to expose the first p-type work function layer, while leaving portions of the BARC layer within the gaps. In some embodiments, etching the first p-type work function layer is performed using an isotropic etch process after etching back the BARC layer. In some embodiments, the method further comprises after performing the isotropic etch process, removing the BARC layer. In some embodiments, the isotropic etch process removes portions of the first p-type work function layer from sidewalls of the second nanostructures. In some embodiments, the isotropic etch process removes a portion of the first p-type work function layer from a top surface of the insulation material. In some embodiments, the isotropic etch process removes a portion of the first p-type work function layer from a top surface of the dielectric fin. In some embodiments, the method further comprises forming one or more n-type work function layers over the second p-type work function layer.

In some embodiments, a method of forming a semiconductor device comprises the following steps. A fin structure is formed extruding from a substrate. The fin structure comprises first semiconductor layers and second semiconductor layers alternately stacked. A dummy gate structure is formed over the fin structure. The dummy gate structure is removed to form a gate trench. The first semiconductor layers are etched in the gate trench. A gate dielectric layer is deposited in the gate trench. The gate dielectric layer wraps around the second semiconductor layers. A deposition process is performed to form a first p-type work function layer in the gate trench. The first p-type work function layer is removed in the gate trench. After removing the first p-type work function layer, a second p-type work function layer is formed in the gate trench. A n-type work function layer is formed in the gate trench. In some embodiments, the first p-type work function layer has a thickness less than a half of a vertical distance between the second semiconductor layers. In some embodiments, the second p-type work function layer has a thickness less than a half of a vertical distance between the second semiconductor layers. In some embodiments, the method further comprises the following steps. Prior to removing the first p-type work function layer, an organic material is formed filling the gate trench and between the two neighboring second semiconductor layers. An etch process is performed to remove the organic material in the gate trench. In some embodiments, the method further comprises after performing the etch process, ashing the organic material between the two neighboring second semiconductor layers. In some embodiments, after performing the etch process, the first p-type work function layer in the gate trench remains intact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming fins protruding from a substrate, wherein each of the fins has alternating stacked first nanostructures and second nanostructures;

forming a dielectric fin on a first side of one of the fins;

forming an insulation material on a second side of the one of the fins opposite to the first side;

removing the first nanostructures to form gaps each between adjacent two of the second nanostructures;

forming a first p-type work function layer continuously extending across the gaps;

etching the first p-type work function layer to break the first p-type work function layer into separate first p-type work function sublayers respectively confined within the gaps; and after etching the first p-type work function layer to break the first p-type work function layer into the first p-type work function sublayers, forming a second p-type work function layer across the first p-type work function sublayers.

2. The method of claim 1, further comprising:

forming a bottom anti-reflection coating (BARC) layer on the first p-type work function layer; and etching back the BARC layer to expose the first p-type work function layer, while leaving portions of the BARC layer within the gaps.

3. The method of claim 2, wherein etching the first p-type work function layer is performed using an isotropic etch process after etching back the BARC layer.

4. The method of claim 3, further comprising:

after performing the isotropic etch process, removing the BARC layer.

5. The method of claim 3, wherein the isotropic etch process removes portions of the first p-type work function layer from sidewalls of the second nanostructures.

6. The method of claim 3, wherein the isotropic etch process removes a portion of the first p-type work function layer from a top surface of the insulation material.

7. The method of claim 3, wherein the isotropic etch process removes a portion of the first p-type work function layer from a top surface of the dielectric fin.

8. The method of claim 7, further comprising:

forming one or more n-type work function layers over the second p-type work function layer.

9. A method of forming a semiconductor device, comprising:

forming fins protruding from a substrate, wherein each of the fins has alternating stacked first nanostructures and second nanostructures arranged in a z-axis;

removing the first nanostructures to form gaps each between adjacent two of the second nanostructures; and forming a gate stack wrapping around the second nanostructures, wherein the gate stack comprises:

a gate dielectric layer wrapping around the second nanostructures; and a p-type work function material on the gate dielectric layer, wherein the p-type work function material has a first thickness along the z-axis above a topmost one of the second nanostructures and a second thickness along the z-axis between neighboring two of the second nanostructures, and the first thickness is less than the second thickness, the p-type work function material comprises:

separated first p-type work function sublayers overlapping in a direction perpendicular to the substrate; and a second p-type work function layer across the separated first p-type work function sublayers, the second p-type work function layer is in physical contact with the gate dielectric layer.

10. The method of claim 9, further comprising:

forming gate spacers on opposite sides of the gate stack, wherein the gate spacers are separated in an x-axis perpendicular to the z-axis, the p-type work function material has a portion between the gate spacers with a third thickness along the z-axis, and the third thickness is less than the second thickness.

11. The method of claim 9, wherein the p-type work function material above the topmost one of the second nanostructures is free of the separated first p-type work function sublayers.

12. The method of claim 9, wherein in a y-axis perpendicular to the x-axis, the second nanostructures each have a width greater than a width of one of the separated first p-type work function sublayers.

13. The method of claim 9, wherein the second p-type work function layer has a material different from a material of the separated first p-type work function sublayers.

14. A method of forming a semiconductor device, comprising:

forming fins protruding from a substrate, wherein each of the fins has alternating stacked first nanostructures and second nanostructures;

removing the first nanostructures to form gaps each between adjacent two of the second nanostructures; and performing a deposition process to form a first p-type work function layer within the gaps, the first p-type work function layer having a thickness less than a vertical distance between the adjacent two of the second nanostructures;

etching the first p-type work function layer to break the first p-type work function layer into separate first p-type work function sublayers respectively confined within the gaps, the separate first p-type work function sublayers overlap in a direction perpendicular to the substrate; and forming a second p-type work function layer across the first p-type work function sublayers.

15. The method of claim 14, wherein the thickness of the first p-type work function layer is less than a half of the vertical distance between the adjacent two of the second nanostructures.

16. The method of claim 14, wherein the second p-type work function layer has a thickness less than a half of the vertical distance between the adjacent two of the second nanostructures.

17. The method of claim 14, further comprising:

prior to removing the first p-type work function layer, forming an organic material filling between the adjacent two of the second nanostructures; and performing an etch process to remove the organic material between the adjacent two of the second nanostructures.

18. The method of claim 17, further comprising:

after performing the etch process, ashing the organic material between the adjacent two of the second nanostructures.

19. The method of claim 17, wherein after performing the etch process, the first p-type work function layer between the adjacent two of the second nanostructures remains intact.

20. The method of claim 1, wherein the insulation material is thinner than the dielectric fin in a direction vertical to the substrate.

* * * * *